(12) United States Patent
Sachs et al.

(10) Patent No.: US 9,932,689 B2
(45) Date of Patent: *Apr. 3, 2018

(54) SEMICONDUCTOR WAFERS RECRYSTALLIZED IN A PARTIALLY SURROUNDING THIN FILM CAPSULE

(71) Applicant: Massachusetts Institute of Technology, Cambridge, MA (US)

(72) Inventors: Emanuel M Sachs, Newton, MA (US); James G. Serdy, Boston, MA (US); Eerik T. Hantsoo, Atlanta, GA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 247 days.

This patent is subject to a terminal disclaimer.

(21) Appl. No.: 14/155,546

(22) Filed: Jan. 15, 2014

(65) Prior Publication Data
US 2014/0124963 A1  May 8, 2014

Related U.S. Application Data

(63) Continuation of application No. 12/665,495, filed as application No. PCT/US2008/008030 on Jun. 26, 2008, now Pat. No. 8,633,483.
(Continued)

(51) Int. Cl.
*C30B 13/00* (2006.01)
*C30B 1/02* (2006.01)
(Continued)

(52) U.S. Cl.
CPC ............... *C30B 13/00* (2013.01); *C30B 1/02* (2013.01); *C30B 28/02* (2013.01); *C30B 29/06* (2013.01);
(Continued)

(58) Field of Classification Search
CPC ........... C30B 13/00; C30B 28/08; C30B 1/02; C30B 28/02; H01L 21/02667
See application file for complete search history.

(56) References Cited

U.S. PATENT DOCUMENTS

| | | | |
|---|---|---|---|
| 4,196,041 | A | 4/1980 | Baghdadi et al. |
| 4,315,479 | A | 2/1982 | Toole et al. |

(Continued)

FOREIGN PATENT DOCUMENTS

| | | |
|---|---|---|
| DE | 2659436 A1 | 12/1976 |
| EP | 1180392 A1 | 7/2001 |

(Continued)

OTHER PUBLICATIONS

Notification of Reasons of Refusal from the Japanese Patent Office dated Jun. 4, 2013; The Japanese Patent Application No. 2010-514829 also claims priority to PCT/US2008/08030, to which the present application also claims priority.
(Continued)

*Primary Examiner* — Moazzam Hossain
*Assistant Examiner* — Farun Lu
(74) *Attorney, Agent, or Firm* — Steven J. Weissburg

(57) ABSTRACT

An original wafer, typically silicon, has the form of a desired end PV wafer. The original may be made by rapid solidification or CVD. It has small grains. It is encapsulated in a clean thin film, which contains and protects the silicon when recrystallized to create a larger grain structure. The capsule can be made by heating a wafer in the presence of oxygen, or steam, resulting in silicon dioxide on the outer surface, typically 1-2 microns. At least one support element supports the wafer at the time the capsule is provided and blocks only minimal surface area from contact with the film forming atmosphere. There may be a plurality of support elements, or a surface may provide such support. The capsule contains
(Continued)

the molten material during recrystallization, and protects against impurities. Recrystallization may be in air. After recrystallization, the capsule is removed.

13 Claims, 20 Drawing Sheets

Related U.S. Application Data

(60) Provisional application No. 60/937,129, filed on Jun. 26, 2007.

(51) Int. Cl.
| | |
|---|---|
| *C30B 28/02* | (2006.01) |
| *C30B 29/06* | (2006.01) |
| *H01L 21/02* | (2006.01) |
| *H01L 23/31* | (2006.01) |
| *H01L 29/04* | (2006.01) |

(52) U.S. Cl.
CPC .. *H01L 21/02532* (2013.01); *H01L 21/02667* (2013.01); *H01L 23/3171* (2013.01); *H01L 29/04* (2013.01); *H01L 2924/0002* (2013.01)

(56) References Cited

U.S. PATENT DOCUMENTS

| | | | |
|---|---|---|---|
| 4,461,670 A | 7/1984 | Celler et al. | |
| 4,590,130 A | 5/1986 | Cline | |
| 4,944,835 A | 7/1990 | Allen et al. | |
| 5,173,271 A * | 12/1992 | Chen | C30B 13/00 118/407 |
| 5,741,359 A | 4/1998 | Motoda et al. | |
| 5,891,244 A | 4/1999 | Kim et al. | |
| 6,111,191 A | 8/2000 | Hall et al. | |
| 6,589,824 B2 | 7/2003 | Ohtani et al. | |
| 6,699,401 B1 | 3/2004 | Horiuchi et al. | |
| 2002/0153360 A1 * | 10/2002 | Yamazaki | B23K 26/034 219/121.66 |
| 2004/0035460 A1 | 2/2004 | Gonsiorawski | |
| 2004/0123897 A1 | 7/2004 | Ojima et al. | |
| 2005/0121111 A1 | 6/2005 | Oana et al. | |
| 2005/0176218 A1 * | 8/2005 | Jonczyk | C30B 13/00 438/478 |
| 2005/0230678 A1 | 10/2005 | Cao et al. | |
| 2006/0003548 A1 | 1/2006 | Kobrinsky et al. | |
| 2006/0151820 A1 | 7/2006 | Duan et al. | |
| 2012/0164760 A1 * | 6/2012 | Straboni | H01L 21/02667 438/14 |

FOREIGN PATENT DOCUMENTS

| | | | |
|---|---|---|---|
| JP | 1986-077513 | 4/1986 | |
| JP | 1987-33418 | 2/1987 | |
| JP | 1987-500517 | 3/1987 | |
| JP | 1987-285412 | 12/1987 | |
| JP | 1988-025209 | 2/1988 | |
| JP | 6325209 | * 2/1988 | ............ C01B 33/02 |
| JP | 04-034961 | 5/1992 | |
| JP | 1992-253323 | 9/1992 | |
| JP | 1999-260721 | 9/1999 | |
| JP | 2001-516324 | 9/2001 | |
| WO | WO 86/02111 | 4/1986 | |
| WO | PCT/DE89/00226 | 11/1989 | |
| WO | WO 98/39804 | 9/1998 | |

OTHER PUBLICATIONS

Written Opinion of Intellectual Property Office of Singapore, dated Mar. 17, 2011. The Singapore Patent Application No. 200908246-2 also claims priority to PCT/US2008/08030, to which the present application also claims priority.
Extended European Search Report dated Jun. 1, 2011. The European Patent Application No. 08 779 827.8-1235 also claims priority to PCT/US2008/08030, to which the present application also claims priority.
European Communication pursuant to Article 94(3) dated May 10, 2012. The European Patent Application No. 08 779 827.8-1235 also claims priority to PCT/US2008/08030, to which the present application also claims priority.
H.A. Atwater, Zone-Melting Recrystallization of Thick Silicon Insulator Films, Mar. 1984, Materials Letters, vol. 2, No. 4A.
PCT International Search Report and Written Opinion, PCT/US2008/08030, dated Oct. 9, 2008.
English translation of Notification of Reason for Rejection from the Korean Intellectual Property Office dated May 19, 2015; The Korean Patent Application No. 2009-7026653 now issued as Patent No. 10-1527139, also claims priority to PCT/US2008/08030, to which the present application also claims priority.
European Communication pursuant to Article 94(3) dated Jun. 25, 2015. The European Patent Application No. 08 779 827.8-1235 also claims priority to PCT/US2008/08030, to which the present application also claims priority.

* cited by examiner

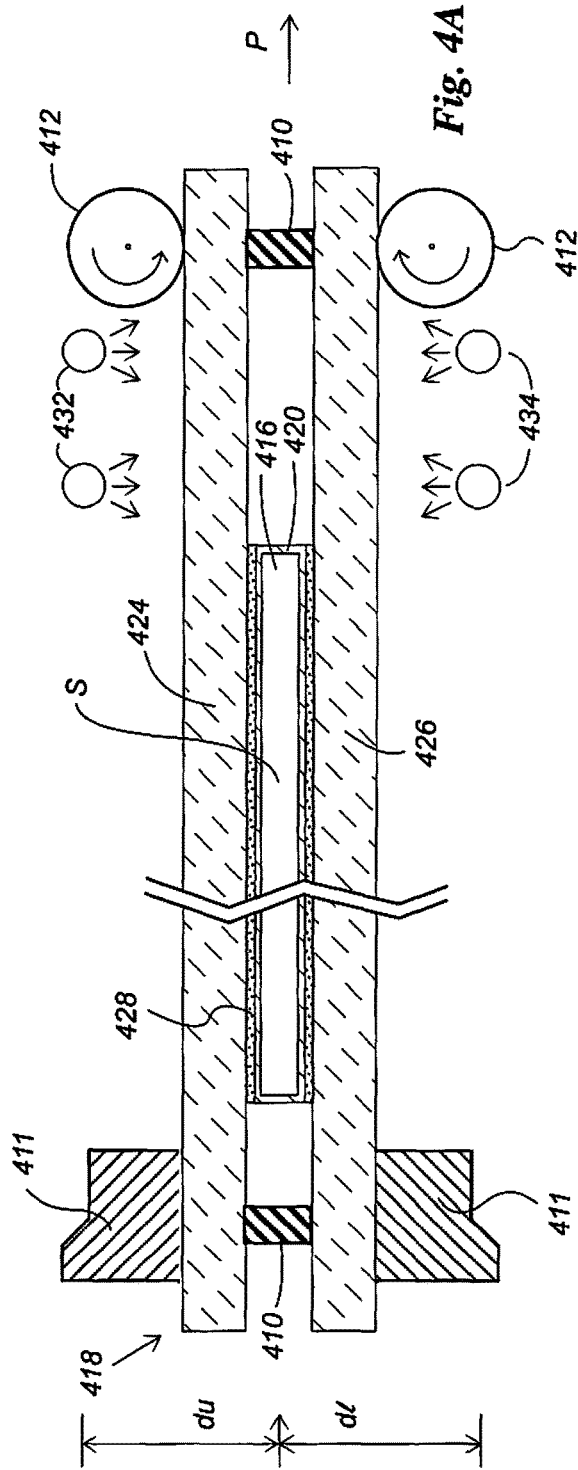
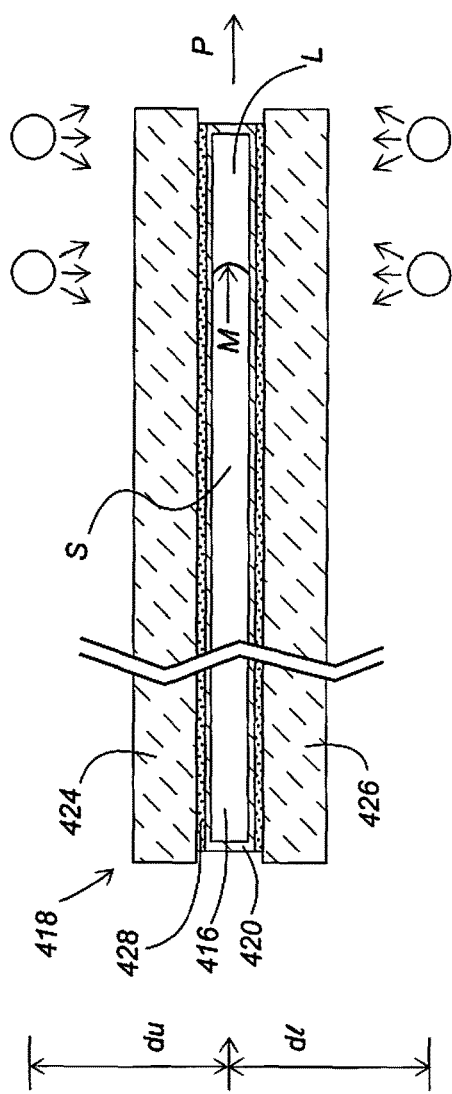
Fig. 4A
Fig. 4B

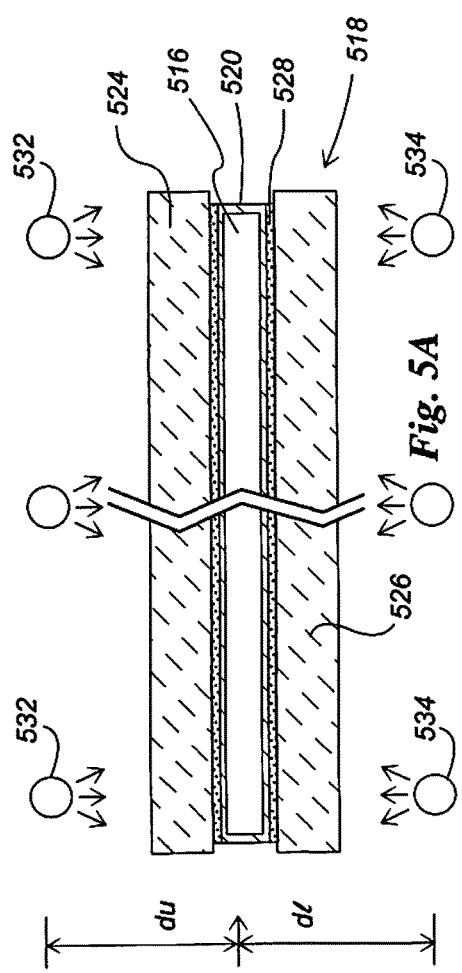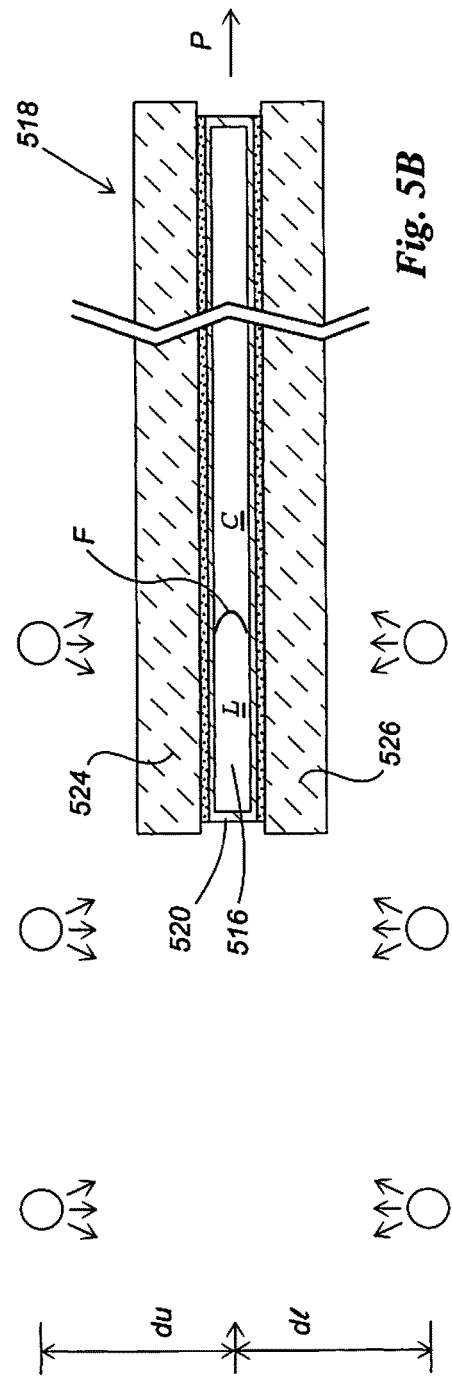

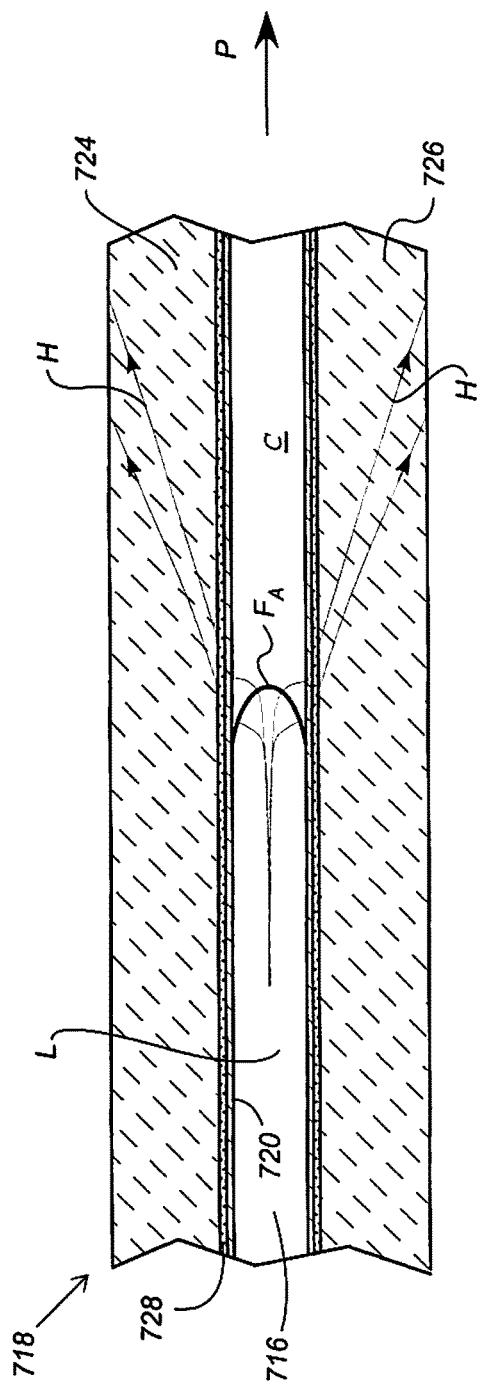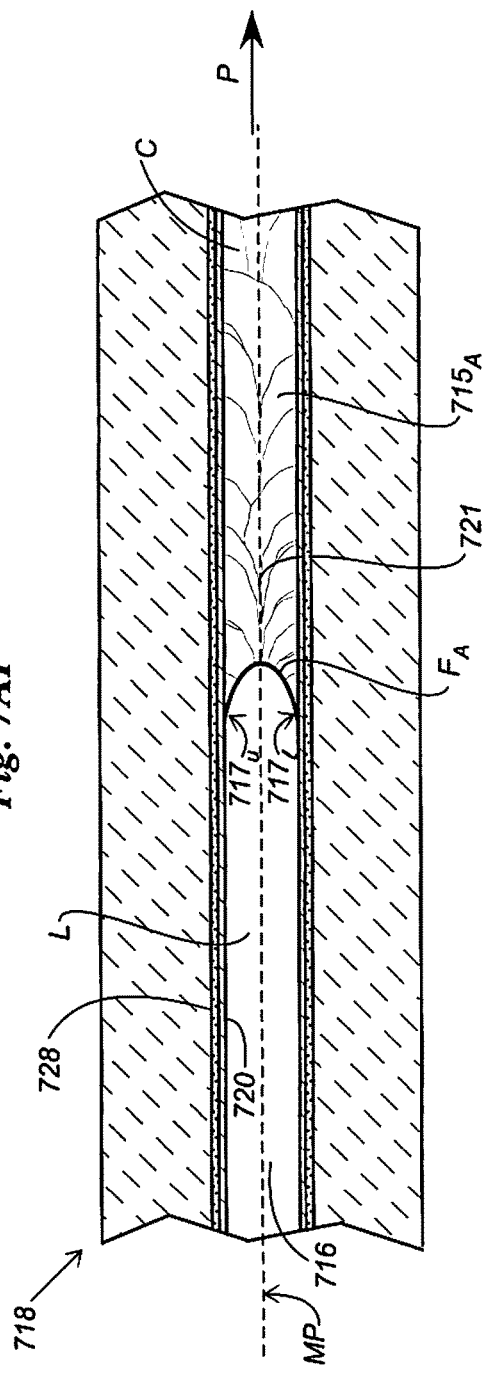

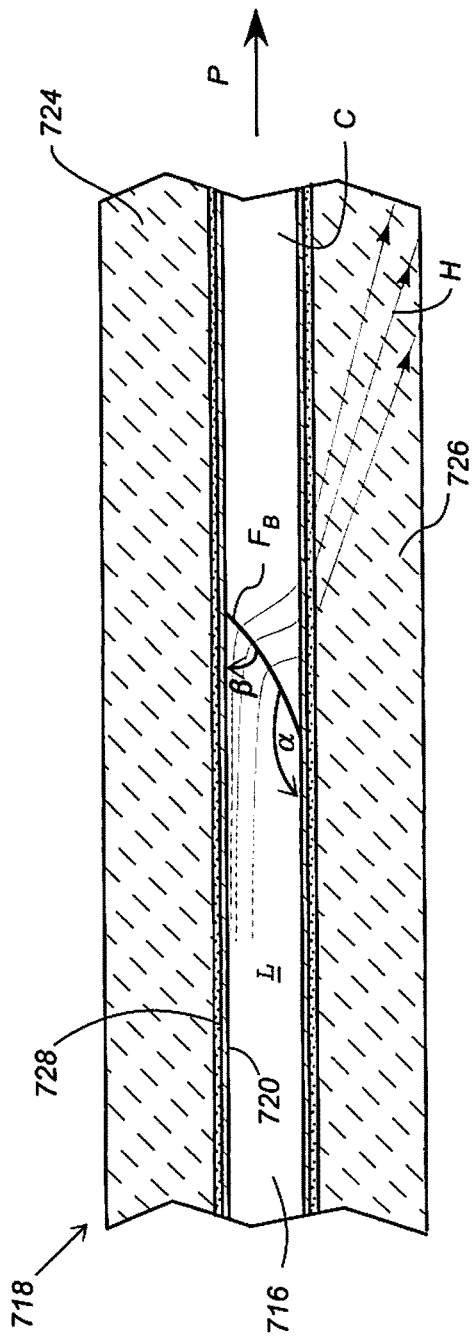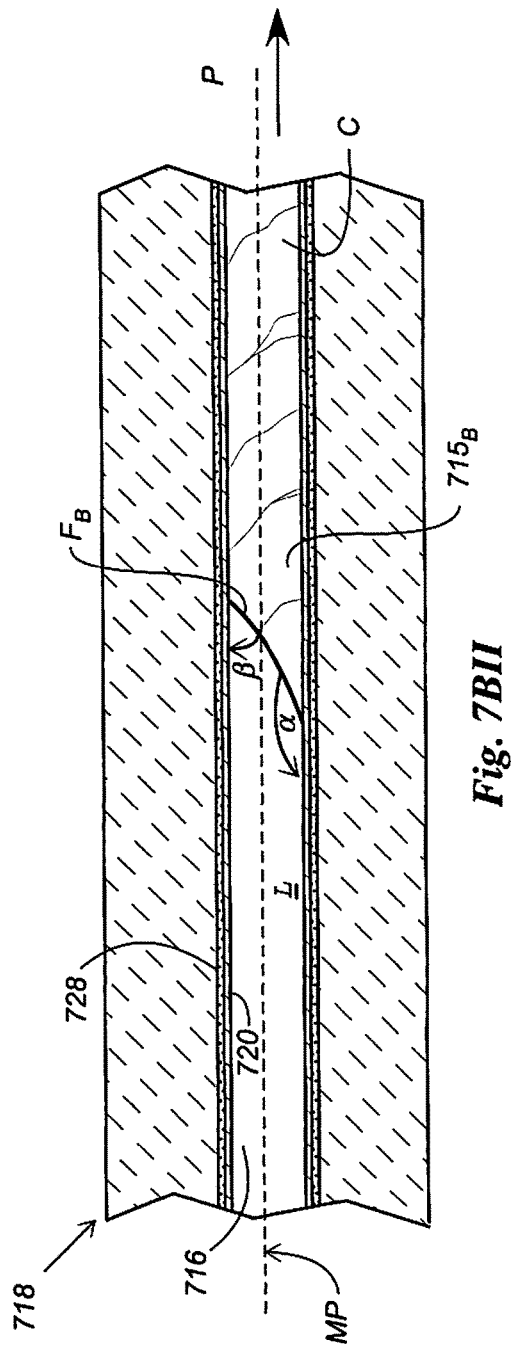
Fig. 7BI
Fig. 7BII

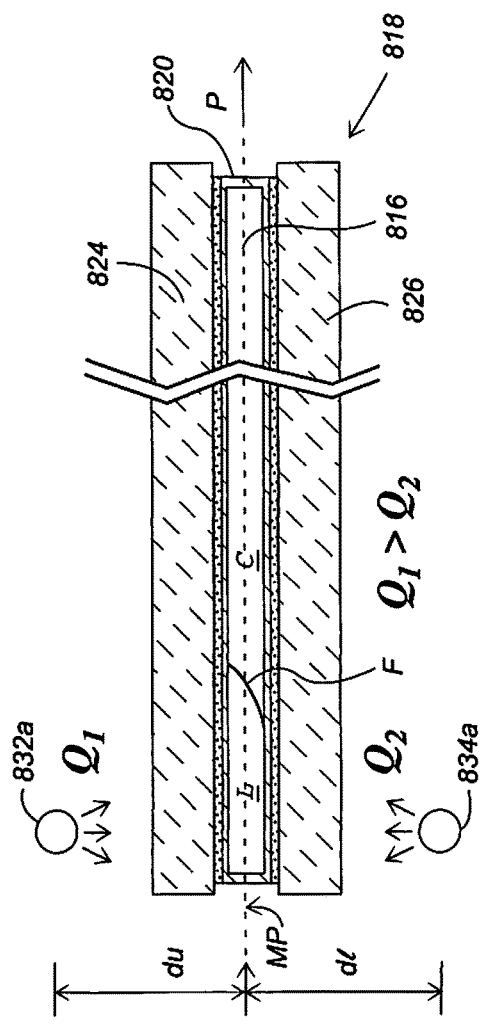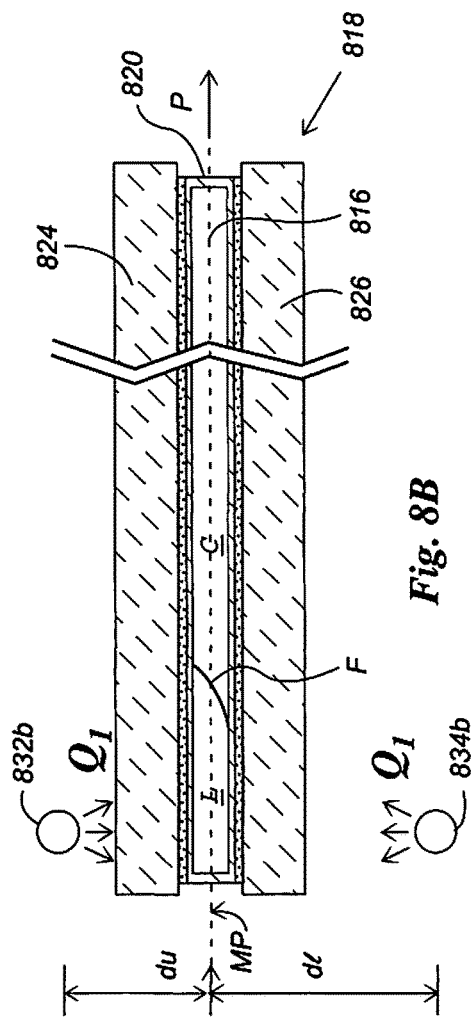

SEMICONDUCTOR WAFERS RECRYSTALLIZED IN A PARTIALLY SURROUNDING THIN FILM CAPSULE

RELATED DOCUMENTS

The benefit of U.S. Provisional application No. 60/937,129, filed on Jun. 26, 2007, entitled Casting and Directional Solidification of Photovoltaic Silicon Wafers in a Capsule and Related Processes, is hereby claimed, and the entire disclosure is hereby incorporated fully herein, by reference. The present application hereby claims the benefit of and is a continuation of U.S. Ser. No. 12/665,495, filed on Dec. 18, 2009, with a section 371(e) date of Jun. 23, 2010, entitled RECRYSTALLIZATION OF SEMICONDUCTOR WAFERS IN A THIN FILM CAPSULE AND RELATED PROCESSES, which is about to issue on Jan. 21, 2014 as U.S. Pat. No. 8,633,483 and which was a 35 U.S.C. §371 national phase application of PCT/US08/08030, of the same title, having an international filing date of Jun. 26, 2008, the benefit of which is also claimed, which itself claimed the benefit of the above referenced Provisional application No. 60/937,129 and the entire disclosures of both the US national phase and the PCT applications are hereby incorporated fully herein by reference.

INTRODUCTION

Crystalline silicon wafers (both single-crystal and multi-crystalline) are the basic building block in the vast majority of photovoltaic modules being manufactured today. Except for the small market share held by ribbon silicon, all these wafers are made by sawing up ingots. Sawing is itself quite expensive and, in addition, wastes over half of the expensive silicon raw material to sawn dust. The result is that the cost of the wafer accounts for almost half the cost of manufacturing a photovoltaic module.

Ribbon approaches, on the other hand, produce material which is less flat and more highly defected than ingot-sawn wafers. The high temperature gradients needed during the solidification of the ribbon cause this. Thus, while the ribbon technologies offer lower cost per unit area, this benefit is offset by lower cell efficiencies.

Thus, an objective of inventions disclosed herein is to create a silicon wafer-making technology that will set a new standard by combining high electronic quality and low cost. It is an objective to provide silicon wafers with flatness and defect densities comparable to or better than those of the industry-standard cast and sawn multi-crystalline wafers.

A specific objective is to manufacture silicon wafers with no sawing required. Part of this objective is to provide a way to first create the geometric form of the wafer and then, in a separate process, create the desired crystallographic structure.

One aspect of such an invention is to separate the functions of creating the wafer geometry and creating a suitable grain structure. Another objective is to create the wafer geometry in a first high throughput step. In a second step, the grain structure of the wafer is modified by a directional solidification process.

BRIEF SUMMARY

A more complete summary appears below, immediately preceding the claims. As shown schematically in flowchart form in FIG. 1, in a first step toward the production of a photovoltaic substrate, a preform wafer is created 408, which has substantially the geometric form of the desired end, recrystallized wafer. However, this original wafer is made rapidly, for example, by a rapid solidification process 106. This preform original wafer can, and typically would, consist of very small grains, making it unsuitable for use as a photovoltaic wafer. Silicon is a typically suitable material, although the technique may be applied to other materials.

The preform wafer is then encased 118 in a conformal capsule composed of a clean thin film layer. This expendable, high purity capsule will contain and protect the silicon during the next step, where the encapsulated wafer is recrystallized 122 to create a recrystallized grain structure suitable for photovoltaic application. Such a thin film capsule can be made, for example, by heating a silicon wafer in the presence of steam, resulting in growth of silicon dioxide on the entire outer surface of the wafer. Typically, a layer 1-2 microns thick would be grown. Other materials, or layers of materials, can be used for the capsule as well.

The crystal structure of the wafer is then improved 122 by passing it through a furnace, which creates a region in space where a molten zone arises, through which the wafer travels, resulting in recrystallization, a new and improved crystal structure. The furnace may consist of heater rods and insulation brick. The cooling zone of the furnace must be well controlled to minimize thermally induced stresses and the crystallographic defects caused by them.

The thin film capsule contains the molten material during the recrystallization. It also aids in retaining the shape of the original wafer, although support or backing plates may be required to establish flatness of the product. The thin film capsule acts as a diffusion barrier against impurities entering the wafer. The capsule plays a key role in determining the crystal structure of the resulting final wafer, by controlled nucleation of grains. For some capsule materials, the furnace may be operated in an air environment. For example, if silica is the capsule material on a silicon wafer, operation in air heals any defects in the capsule. The thin nature of the capsule guarantees that there is little stress on the wafer due to any mismatch in coefficient of thermal expansion between wafer and capsule materials. After the recrystallization, the thin film capsule is removed 123, for example by etching. There is no need to do a damage etch, such as is done after conventional sawing formation because there is no damage.

The several objects of inventions disclosed and claimed herein will be more fully understood with reference to the accompanying claims and figures, of which:

FIGURES OF THE DRAWING

FIG. 4A shows, schematically, a wafer within a furnace, that is entirely solid, original crystal form;

FIG. 4B, shows, schematically, the wafer of FIG. 4A, further along within the furnace, with a trailing portion that is still solid, original crystal form, and a leading section that is liquid;

FIG. 5A shows, schematically, a wafer within a furnace, that is entirely liquid, which has had its entire volume brought to its melting point at substantially the same time;

FIG. 5B shows, schematically, the wafer of FIG. 5A, as it is being moved out from within the furnace, with a trailing portion that is liquid, and a leading section that is recrystallized solid;

Figure 4C:
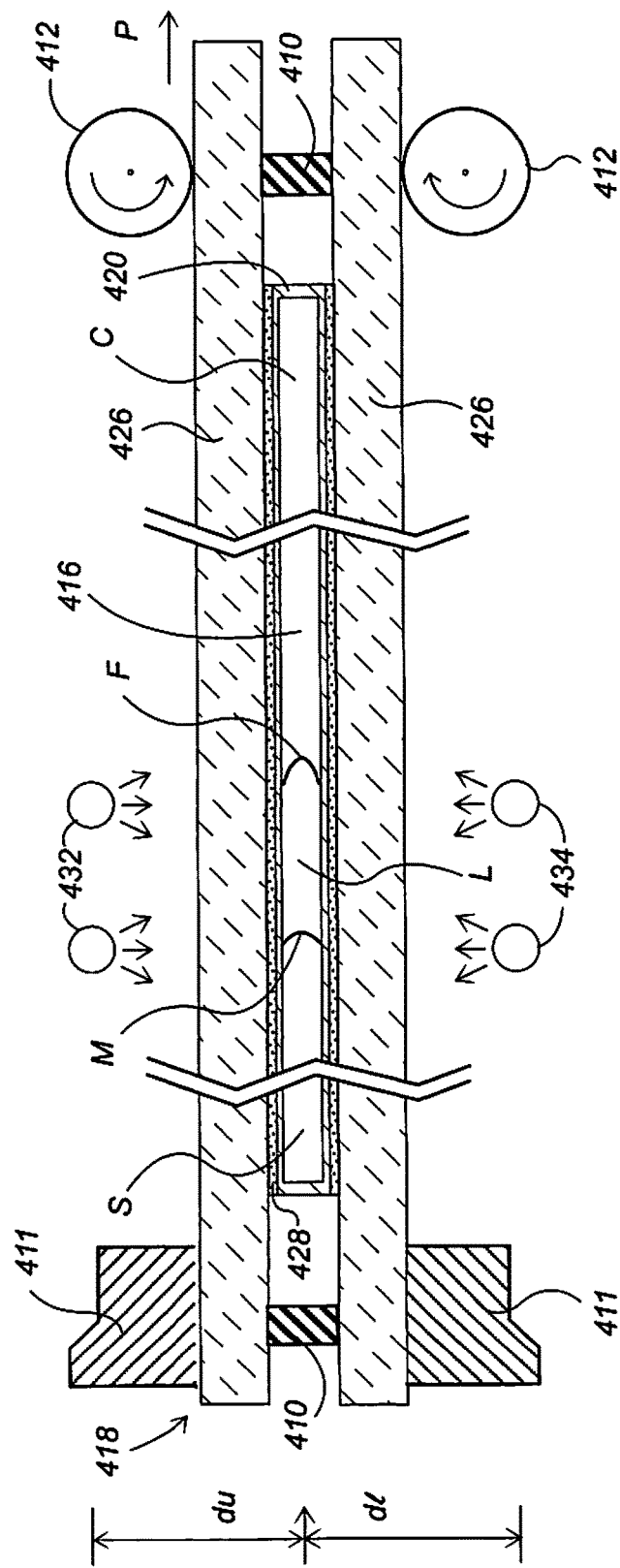
FIG. 4C, shows, schematically, the wafer of FIG. 4A, further along within the furnace, with a trailing portion that is still solid, original crystal form, a middle section that is liquid, and a leading section that is recrystallized solid.
Figure 7:
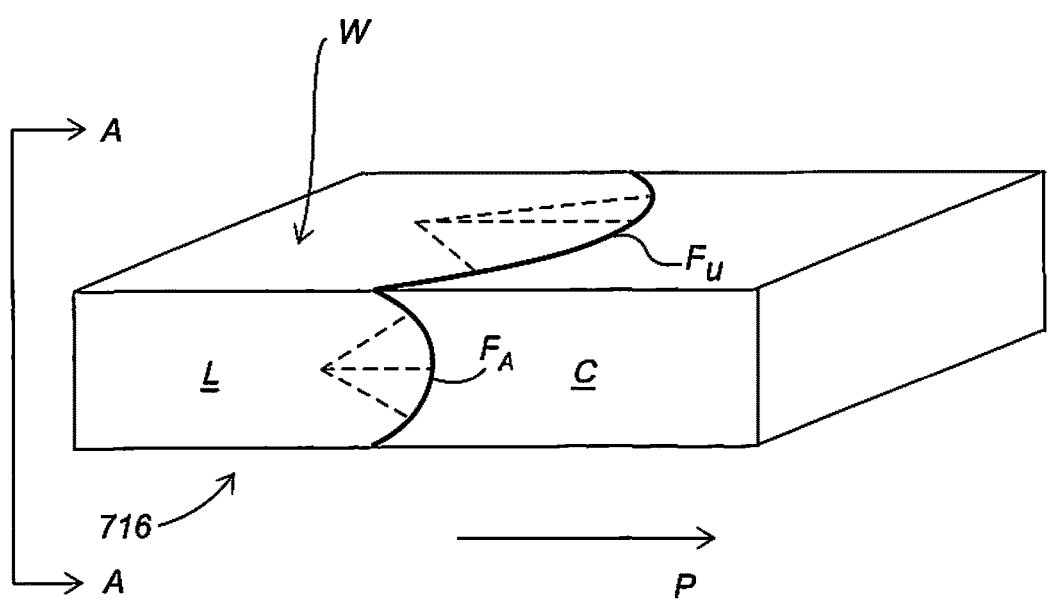
FIG. 7 is a schematic representation in a three-dimensional view, of a wafer, in which crystals are solidified in the right hand side, and growing into the liquid on the left hand side, as the wafer is pulled toward the right in the direction of arrow P, with a crystal growth freeze front $F_A$ that is concave toward the liquid.
Figure 7C:
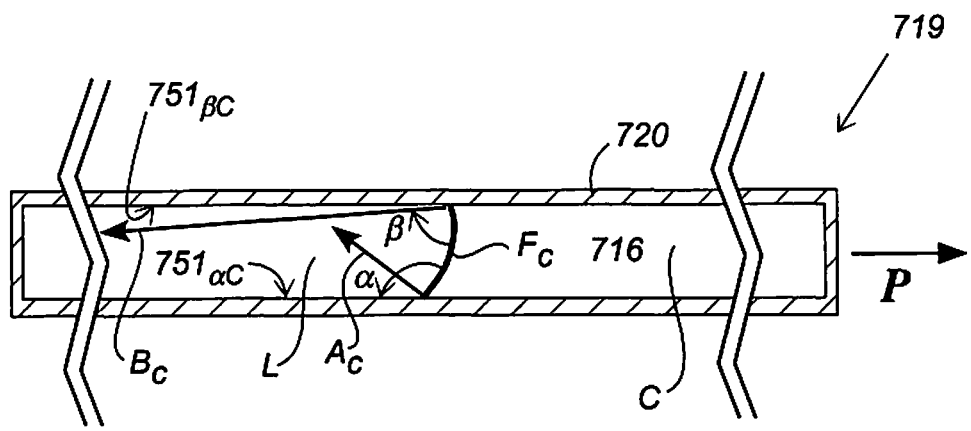
Figure 7D:
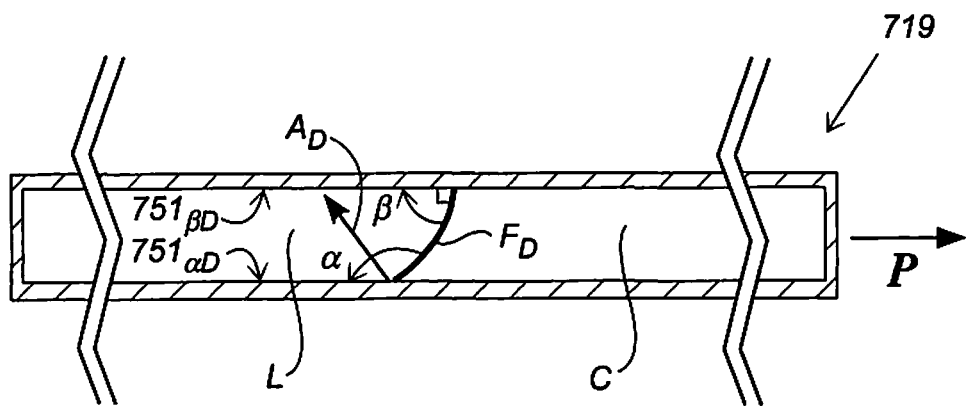
Figure 8C:
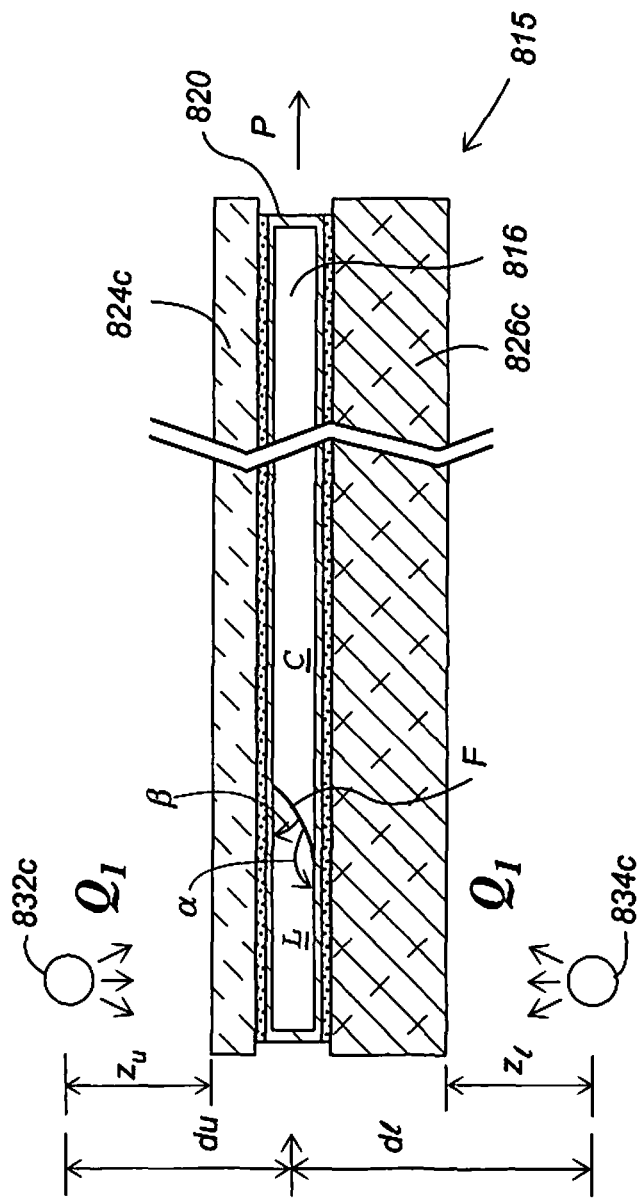
Figure 8D:
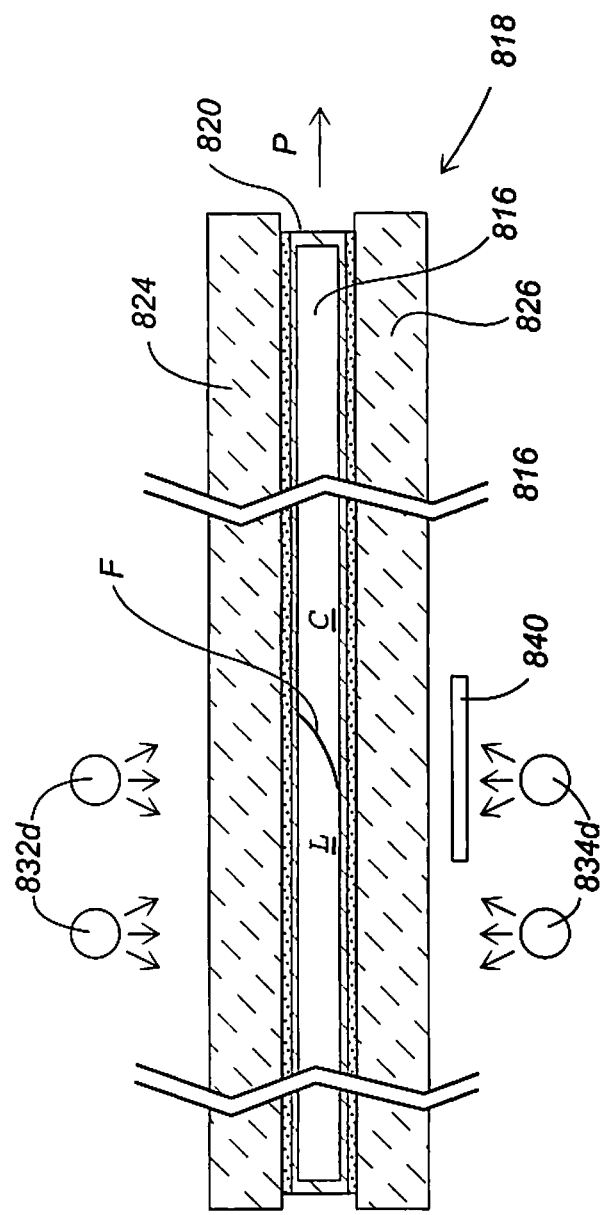
Figure 9:
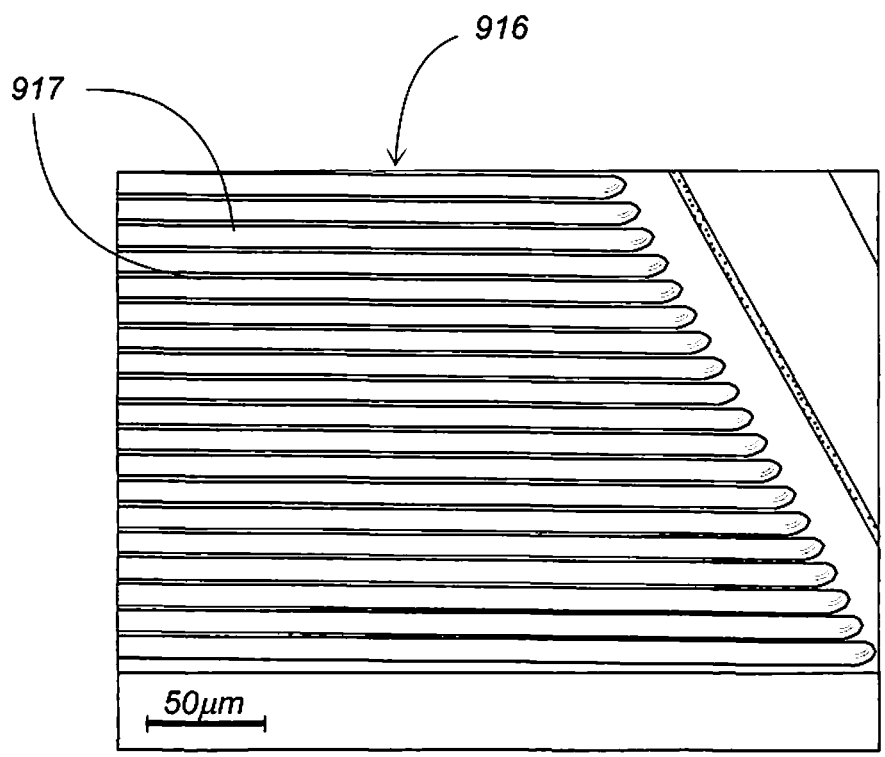
Figure 10:
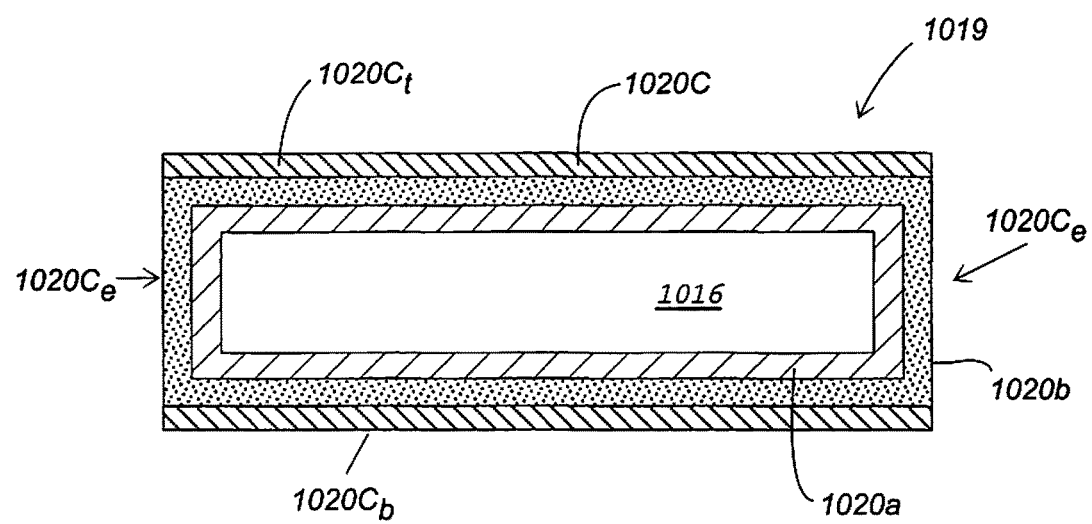
Figure 11:
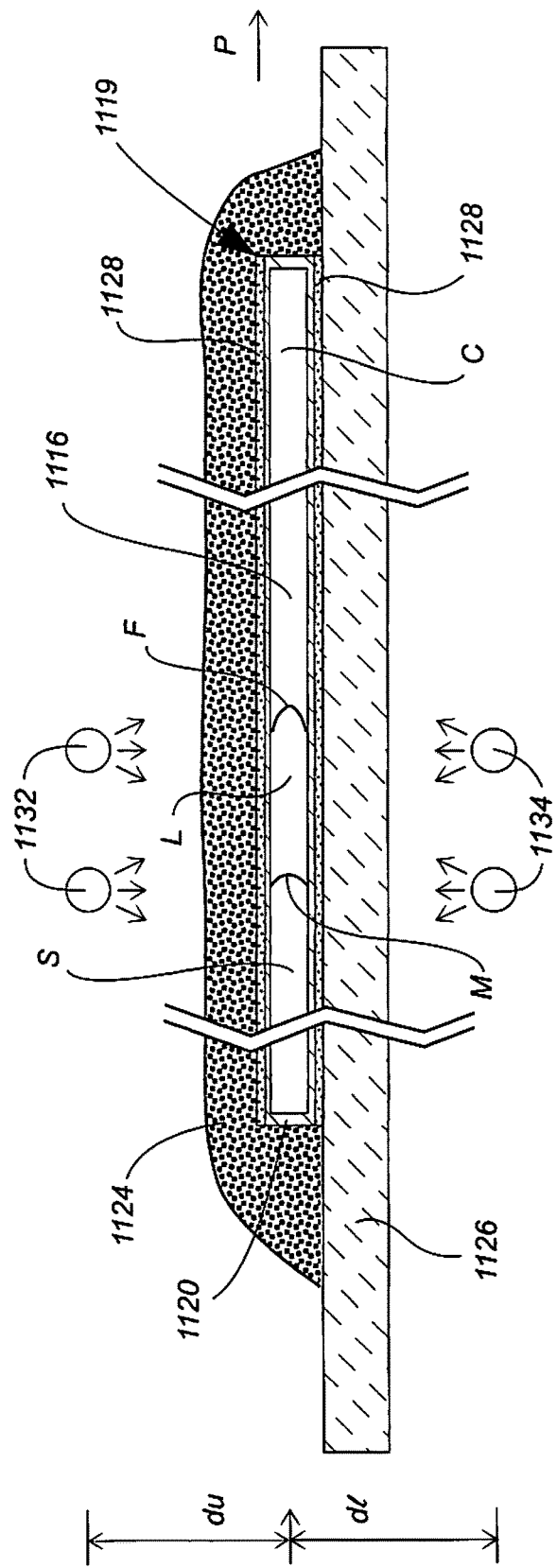
Figure 12:
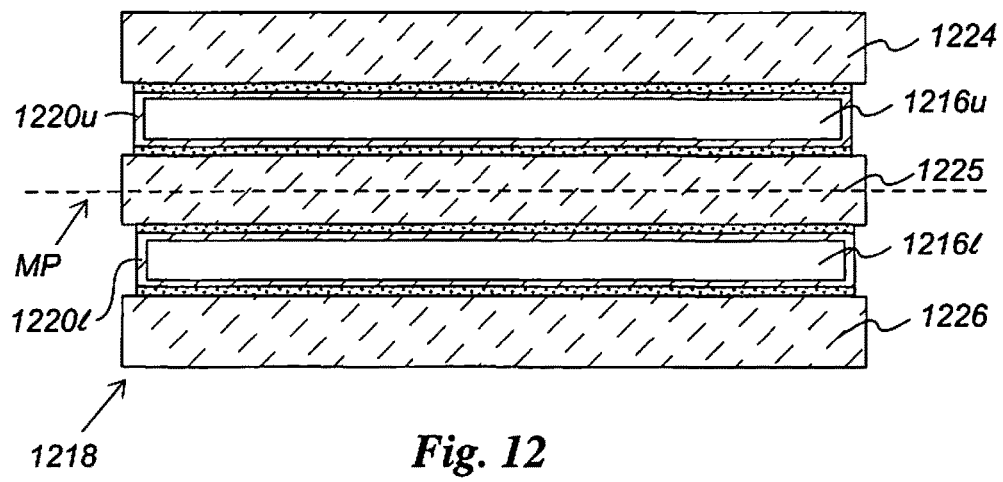
Figure 13:
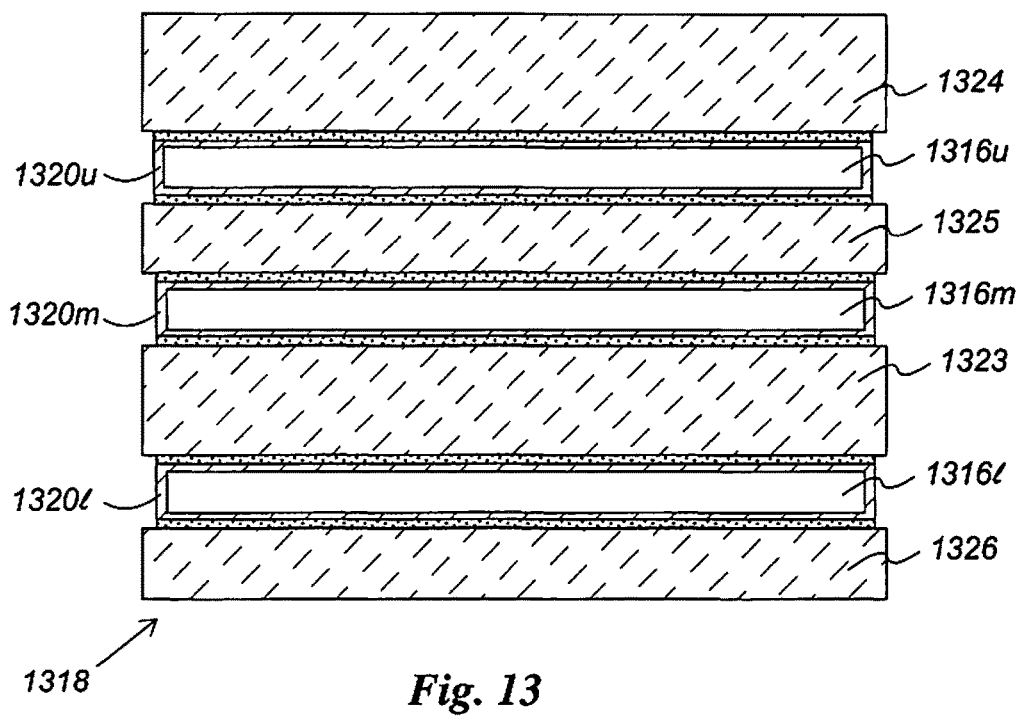
Figure 14A:
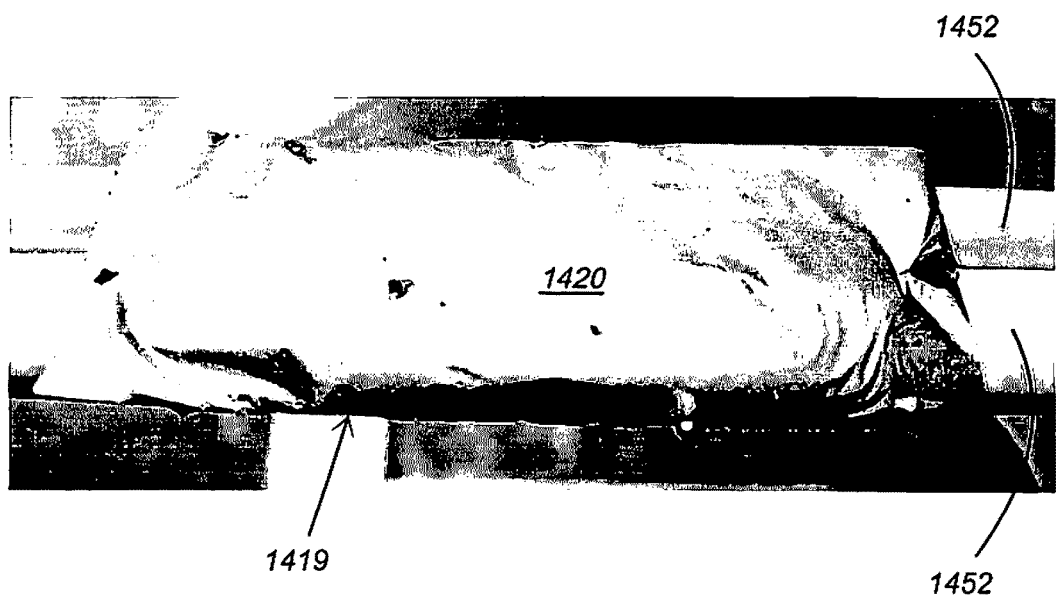
Figure 14B:
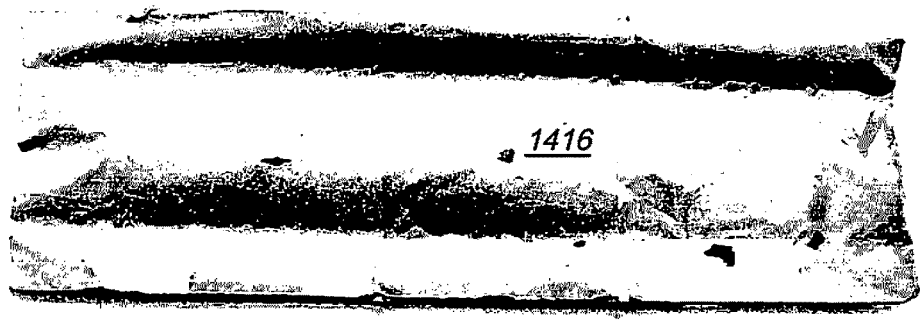
Figure 15:
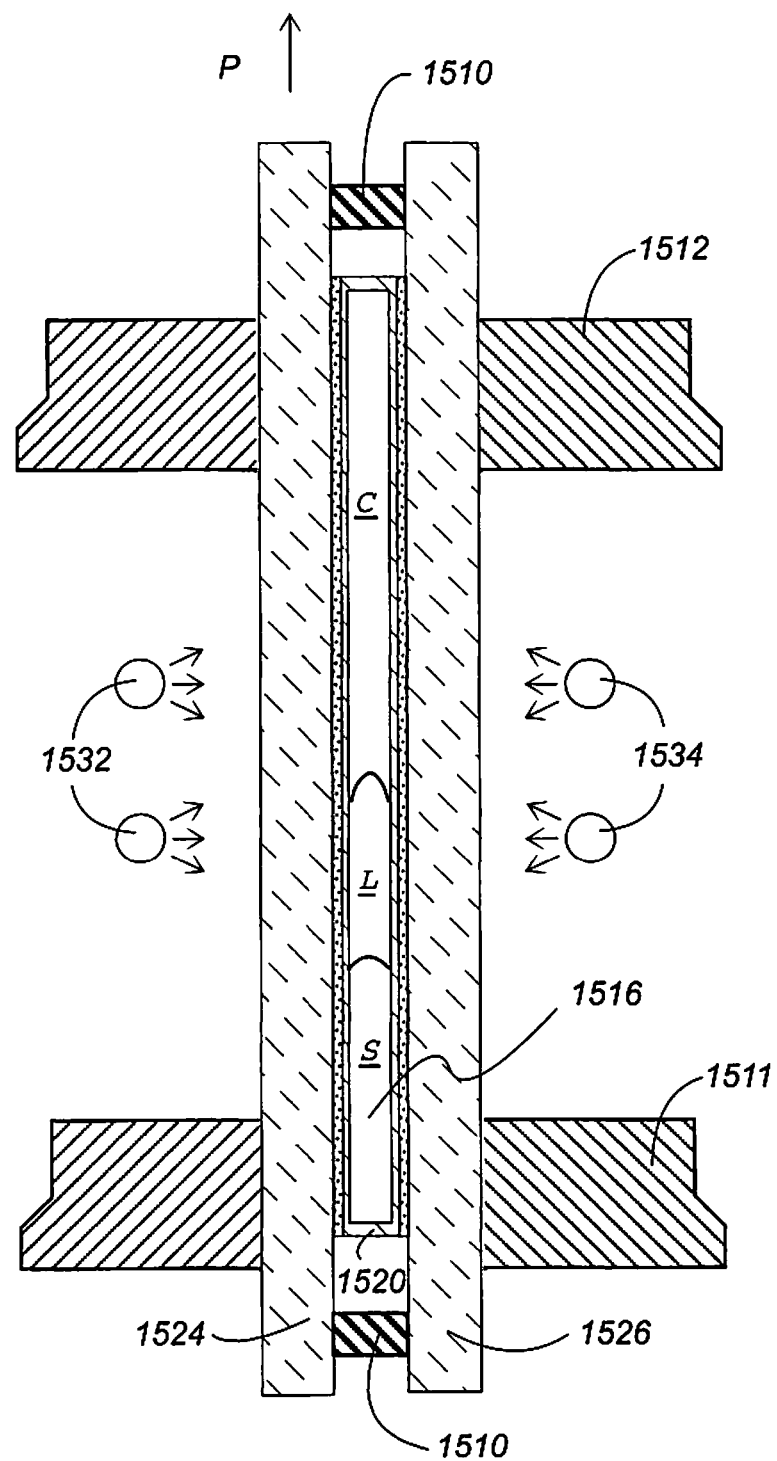

FIG. 7AI is a schematic representation in a cross-sectional view, along line A-A, of FIG. 7, showing heat flow patterns;

FIG. 7AII is a schematic representation showing the crystal growth pattern associated with the freeze front $F_A$ shown in FIG. 7AI;

FIG. 7BI is a schematic representation in a cross-sectional view, showing a beneficially shaped freeze front $F_B$, showing heat flow patterns;

FIG. 7BII is a schematic representation of the wafer shown in FIG. 7BI, showing crystal growth pattern associated with the freeze front $F_B$ shown in FIG. 7BI;

FIG. 7C is a schematic representation in a cross-sectional view, showing a freeze front $F_C$ that is less favorable than that shown in FIG. 7BI, yet still with some utility;

FIG. 7D is a schematic representation in a cross-sectional view, showing a freeze front $F_D$ that is less favorable than that shown in FIG. 7BI yet more beneficial than that shown in FIG. 7C, where the smaller interface angle equals approximately 90 degrees;

FIG. 8A shows, schematically, an apparatus for fabricating an encapsulated wafer of an invention hereof, with upper and lower heaters of different heat output, equally spaced from a wafer being treated;

FIG. 8B shows, schematically, an apparatus for fabricating an encapsulated wafer of an invention hereof, with upper and lower heaters of equal heat output, unequally spaced from a wafer being treated;

FIG. 8C shows, schematically, an apparatus for fabricating an encapsulated wafer of an invention hereof, with upper and lower heaters of equal heat output, with backing plates of unequal thickness supporting a wafer being treated;

FIG. 8D shows, schematically, an apparatus for fabricating an encapsulated wafer of an invention hereof, with a heat shielding element interposed between the heaters and a wafer being treated;

FIG. 9 is a schematic representation of a textured preform, with grooves and ridges running across the wafer surface;

FIG. 10 is a schematic representation showing a wafer preform encapsulated in a multi-layer capsule;

FIG. 11 is a schematic representation showing an embodiment of an invention hereof, using a solid lower backing plate and an upper backing element that is powder;

FIG. 12 is a schematic representation showing a stack of two wafers and three backing plates;

FIG. 13 is a schematic representation showing a stack of three wafers and four backing plates:

FIG. 14A is a digital image of an encapsulated wafer that has been recrystallized without backing plates, while resting on a pair of rods, from the top, showing also the rods;

FIG. 14B is a digital image of the recrystallized wafer shown in FIG. 14A, from the bottom, showing how the wafer has slumped around the support rods; and FIG. 15 shows, schematically a wafer within a furnace, with a trailing portion that is still solid, original crystal form, a middle section that is liquid, and a leading section that is recrystallized solid, arranged to travel vertically through a furnace, rather than horizontally, as shown in FIG. 4C.

DETAILED DESCRIPTION

One approach disclosed herein, is to manufacture silicon wafers with no sawing required, by first creating the geometric form of the wafer and then, in a separate process, creating the desired crystallographic structure. (The sequence is the reverse of ingot methods where the crystallographic structure is created and then, through sawing, the geometric form is created).

Figure 1:
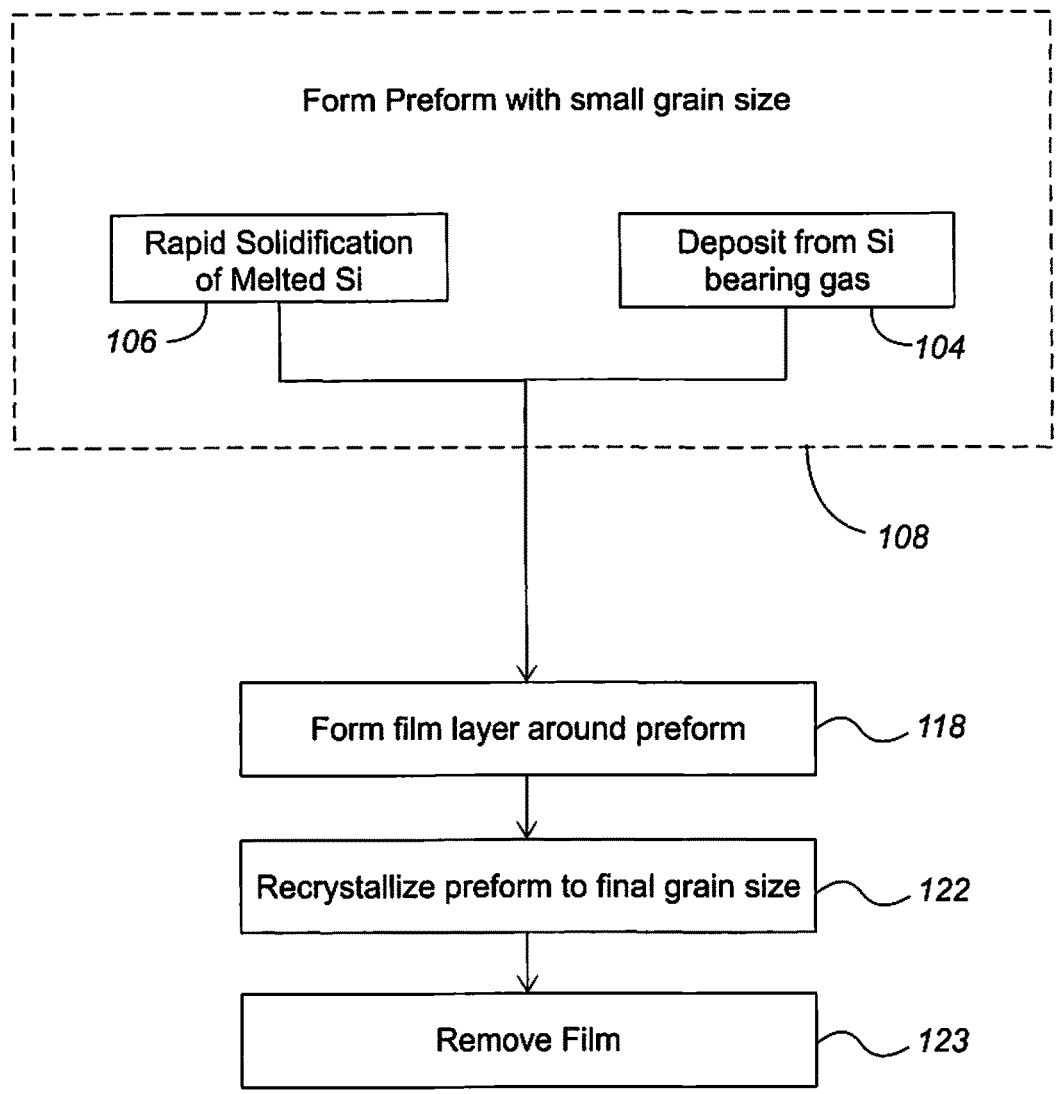
FIG. 1 is a schematic representation in flowchart form of a process of an invention hereof for forming a silicon wafer with a grain structure suitable for photovoltaic use.
Figure 2:
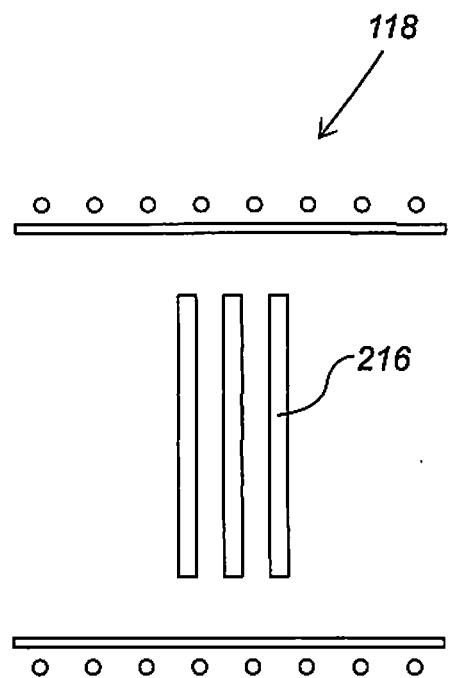
FIG. 2 is a schematic representation showing formation of a thin film capsule all around an original wafer preform.
Figure 3:
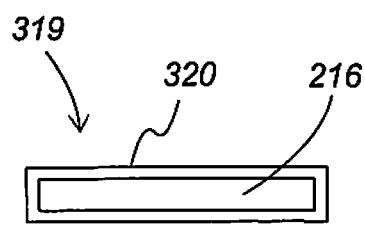
FIG. 3 is a schematic representation of a preform wafer surrounded by a capsule.

An overview of a process is shown with reference to FIG. 1 in flowchart form, and with reference to FIGS. 2 and 3 at various stages of production. As shown in FIG. 1, the geometric form of the wafer may be created in step 108. For instance, rapid solidification techniques 106 can be used, as discussed below. Alternatively, chemical vapor deposition techniques 104 can be used. This results in an original wafer having an average grain size of less than about ten mm², and typically, less that about one mm².

As shown schematically in FIGS. 2 and 3, in an important step, a super-clean, thin film capsule 320 is created 118 around the original wafer 216. This can be done in a furnace with an oxygen containing atmosphere. It is convenient to support the wafer 216 with support elements (not shown) that block only a minimal surface area from full contact with the oxygen containing atmosphere. This capsule 320 acts: i) to retain the silicon and its shape during the subsequent recrystallization step 122; ii) to provide the environment for control of grain nucleation and geometry control, and iii) as a chemical barrier to maintain purity of the silicon. For example, the capsule 320 can be made by the growth or deposition of silicon dioxide. Further, it can be of multiple layers, thereby providing control over grain nucleation through a specialized inner layer, and strength through a specialized outer layer. The capsule can also be formed in different ways. All of this is discussed below. The wafer and capsule form an encapsulated wafer assembly 319.

As shown schematically with reference to FIGS. 4A-4E, the desired crystal structure can be created by zone recrystallization. According to one embodiment, the original wafer 416 is sandwiched between an upper 424 and a lower 426 rigid backing plate (typically SiC). The plates constrain the capsule 420 (and therefore the final wafer) to be flat and also provide a path for heat removal other than the wafer itself. A thin layer of powder 428 (typically silica powder) promotes release of the capsule 420 from the backing plates 424, 426. The wafer and capsule and backing plates together 418 are sometimes referred to herein as a sandwich. Radiant heaters 432, 434 create the molten liquid zone L. At least one upper heater 432 is located a distance du away from the sandwich midline, and at least one lower heater 434 is located a distance d$\ell$ away on the opposite side. (Additional heaters and others not shown may be provided to tailor the cooling profile). Spacers 410 may optionally be provided to maintain the desired dimensions for the finished wafer, to resist the effects of squeezing from forces applied by gravity upon the upper backing plate and any clamping forces from clamping elements 411, provided to maintain the sandwich 418 intact, and also the transport mechanism 412, particularly when the wafer is molten, as discussed below. The clamping elements may be integral, such as a large C-shaped clamp. Or, two or more independently operable elements may be forced together, to clamp the wafer therebetween.

The wafer being treated 416 moves from left to right, as shown in FIGS. 4A-4E, indicated by the arrow P. The transport mechanism is shown schematically by a pair of rollers 412. Any suitable transport mechanism is contemplated to be a part of an invention herein including, but not limited to a pusher furnace or a walking beam transport or a belt transport, as known in the art. The transport may be horizontal, as shown in FIG. 4A-4E or otherwise, as discussed below.

As shown in FIG. 4A, initially, the original wafer 416 is entirely solid, with an undesirable crystal structure predominated by small crystals. As the wafer 416 moves into the furnace (as shown schematically in FIG. 4B), near to the heating elements 432, 434, the leading edge of the wafer melts while the trailing edge remains unmelted. A molten zone L forms within the wafer. A melt interface M forms between the downstream molten zone L and the upstream still solid zone S. The melt interface M is shown in the figures with a specific shape. However, the shape may differ under different conditions of heat input, and is not significantly influential upon any of the processes discussed herein.

As the heated and then cooled wafer 416 moves forward (to the right) in the direction of the arrow P, as shown schematically in FIG. 4C, it eventually moves far enough away from the heat source 432, 434 that the previously molten portion cools and solidifies with a new crystal structure. Between the newly solidified portion C and the liquid portion L, there is a freeze interface F, with liquid material being on the trailing side L (the left) as shown, and solid material on the leading side C.

In general, the location in space of the freeze interface F and the melt interface M, and the molten zone L therebetween, remains substantially stationary with respect to the furnace elements such as the heaters 432, 434. The wafer 416 is moving relative to the stationary locations in space just mentioned. Thus, different parts of the moving wafer 416 change from being initially solid, then to liquid, then to a solid, recrystallized form. Thus, the wafer moves along through the locations in space where a molten zone L forms and then where cooling, recrystallization and solidification takes place.

Figure 4D:
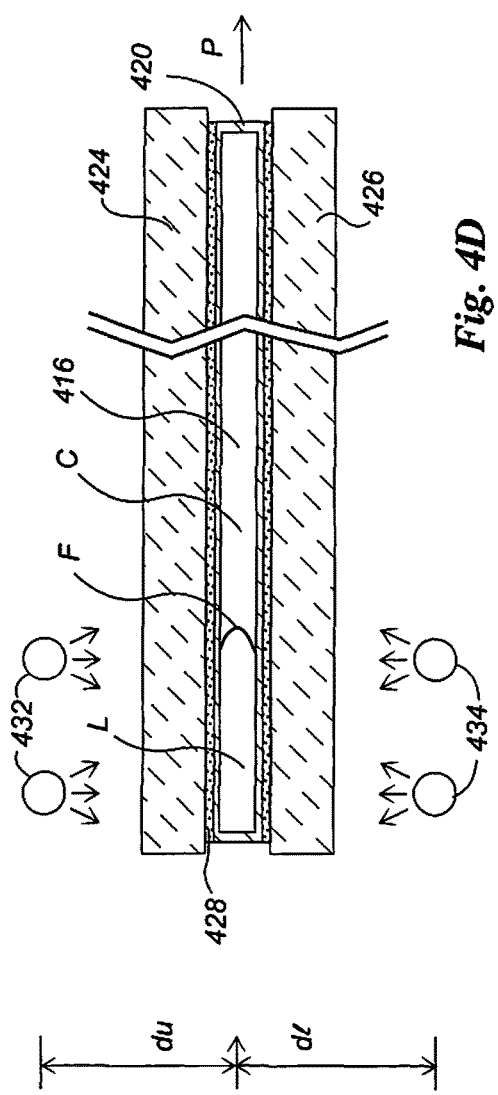
FIG. 4D shows, schematically, the wafer of FIG. 4A, further along within the furnace, with a trailing portion that is liquid, and a leading section that is recrystallized solid.
Figure 4E:
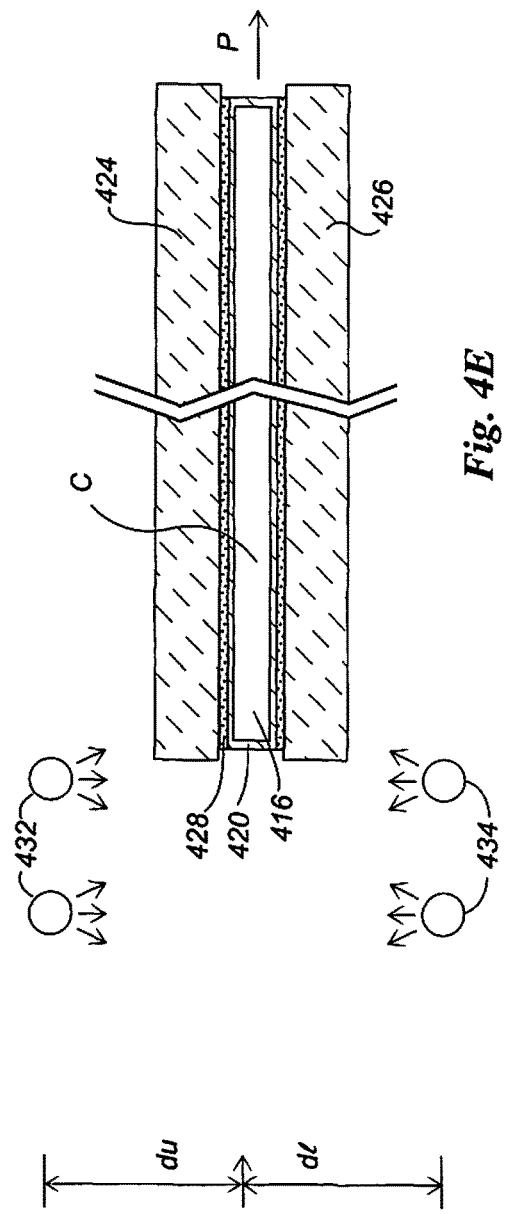
FIG. 4E shows, schematically, the wafer of FIG. 4A, further along within the furnace, now entirely recrystallized solid.

As the wafer 416 continues to move forward to the right, as shown schematically in FIG. 4D, all of the remaining, original crystal structure portion becomes liquid, so that there is no melt interface, only a freeze interface F. Finally, the entire wafer passes through and beyond the freeze interface, F as shown in FIG. 4E, and all is recrystallized solid C with no interface of either melt or freeze.

Figure 6A:
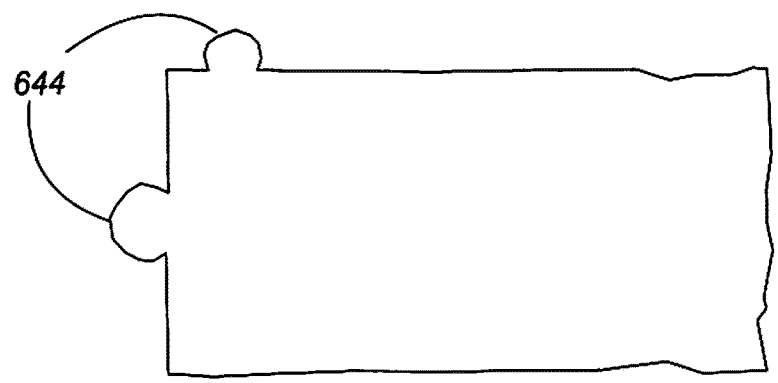
FIG. 6A is a schematic representation of a wafer after recrystallization.

Wafers (both single crystal and multicrystalline) have been oxidized and recrystallized. FIG. 6A shows, schematically, a recrystallized wafer with the oxide capsule intact.

The capsule has been made of dry oxide, wet oxide and layered combinations of oxides.

Oxidized wafers have been recrystallized in air, argon and argon/hydrogen forming gas. Successful results were attained in all three cases. However, in recrystallizations carried out under inert and reducing atmospheres, some cracks in the capsule arose. These cracks allowed leakage of molten silicon out of the capsule. Recrystallizing in air resulted in no such defects. When fired in air, the capsule self-healed by re-oxidation of exposed silicon. Thus, the furnace for recrystallization may beneficially be operated entirely in a natural air atmosphere. It need not be operated in an inert or otherwise special atmosphere.

As an example, the original wafer was 350 µm thick cast multicrystalline silicon. The wafer was oxidized for twenty hours in air and recrystallized as described above. In recrystallized samples, the final grain structure (FIG. 6B, 6C) is different from the original (not shown), which demonstrates that the oxide capsule is capable of not re-nucleating the same grains that existed in the original grain structure. In other words, the oxide capsule imposes no memory effects on the recrystallized grain structure. Furthermore, grain orientation resulting from recrystallization is favorable for good electronic performance of PV devices. As is visible from the top and bottom views of FIGS. 6B, 6C, respectively, grain structures are similar from top to bottom. (Note for instance the grain with an asterisk in each of the images and those surrounding it.) This top to bottom similarity implies that grain boundaries occur principally perpendicular to the plane of the wafer, rather than parallel to it. Grain boundaries parallel to the plane of the wafer degrade electronic performance of solar cells, as grain boundaries function as recombination centers for mobile charge carriers. (Such an undesirable condition is not shown in any of the figures.) Further, the recrystallized wafer is very flat and is of reasonably uniform thickness, within about 10% over its extent, which is markedly better than the standard for cast and sawn crystals, which are believed to have a flatness uniformity of only within about 25%. Methods of minimizing in-plane grain boundaries are discussed below.

Wafers that are recrystallized have a larger average grain size than did the preform before recrystallization. As mentioned above, a preform would have an average grain size of less than about ten mm$^2$, and typically less than about one mm$^2$. The recrystallized wafer has an average grain size of greater than about one mm$^2$ and typically greater than about ten mm$^2$. The absolute size will depend on the nature of the preform, and the process. An important feature is that the second average grain size of the recrystallized wafer is larger than the first, average crystal grain size of the preform.

Another useful feature is that the density of defects, such as dislocations, is significantly reduced. In some circumstances, even if there is no improvement in grain size, an improvement in dislocation density is beneficial.

Wafers that are recrystallized without an oxide capsule ball up severely. The ability of the oxide capsule to prevent gross balling-up of the liquid is very evident by noting the flat shape shown in FIGS. 6B and 6C.

This process can also work with thin wafers. A 150 micron thick, 2 inch [50 mm] diameter [100] monocrystalline wafer was oxidized and recrystallized (and etched) with similar results in grain structure to that discussed above. The grain structures are similar on the top and the bottom of the wafer, indicating that the grain boundaries are not parallel to the wafer surfaces. In general, the process may be used with preform wafers of between about 50 and 400 microns thick, preferably between about 100 and about 250 microns thick.

The leading edge cools, and thus, solidifies, first. In the digital images shown in FIGS. 6B and 6C, the first part of the wafer to solidify is shown on the right, and the last part to solidify is on the left. The volume expansion of silicon upon freezing has led to the eruptions 644 of silicon. The eruptions are excursions of the molten material through the original oxide capsule.

An important aspect of the recrystallization process is that when the solidification is directional, the recrystallized wafer can have higher chemical purity (fewer impurities) than the starting preform. This is because a zone purification takes place as impurities are rejected at the freeze interface and concentrated in the liquid. This impurity segregation is because the majority of impurities, especially metallic impurities, are less soluble in the solid than in the liquid. In this way, the impurities will be concentrated toward the end of the recrystallized wafer. A small amount of the end of the wafer may be trimmed off, thereby removing concentrated impurities and leaving the more pure final wafer. For this purpose, the preform may be provided with some extra length. The eruptions that result from the expansion of silicon as described above will contain very highly concentrated impurities. Cutting off the eruptions alone may remove sufficient material to accomplish the purification.

Figure 6B:
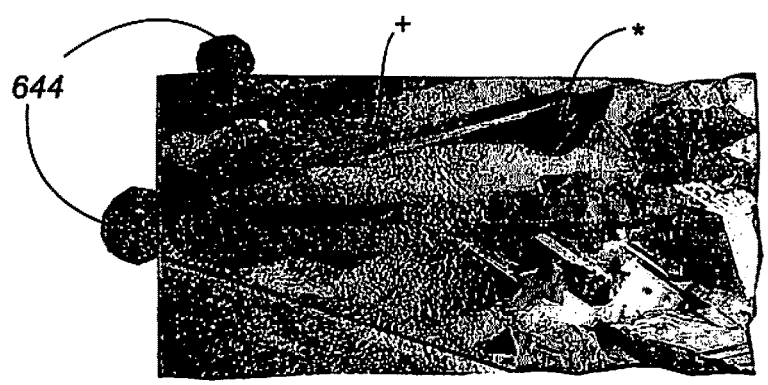
FIGS. 6B and 6C are digital images of a wafer similar to that shown schematically in FIG. 6A after recrystallization, and after etching to remove the capsule, with FIG. 6B showing a top face and FIG. 6C showing a bottom face.
Figure 6C:
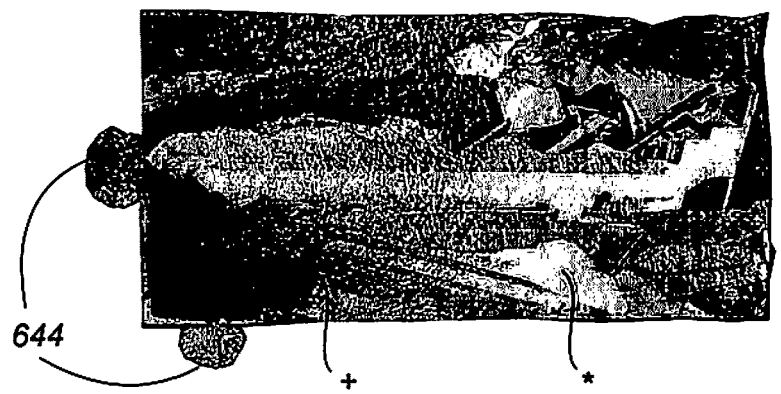

FIGS. 6A, 6B and 6C depict a wafer that was processed between flat backing plates. Even without any backing plates, an oxide capsule retains its shape quite well. FIGS. 14A and 14B show the top and bottom, respectively, of an encapsulated wafer 1419 that was recrystallized in a furnace, while resting directly upon a pair of cylindrical support rods 1452. The wafer 1416, within the capsule 1420 did slump around the rods 1452, but the overall shape remains generally planar, especially as compared to a balled up mass (not shown) that results without any capsule. A wafer that was recrystallized while supported by a lower backing plate, but with no upper, capping backing plate, is flatter than those processed without any backing plates shown in FIGS. 14A and 14B, but the top surface shows some curvature, particularly around the periphery. (No image is shown of this type of product.)

Support to keep the wafer flat may be provided by a lower support element, such as a backing plate, and the intrinsic strength of the capsule, either individually, or in combination. For instance, with some relatively strong capsules, it may be possible to dispense with backing plates, and to support the encapsulated wafer on discrete elements, such as rods, etc.

The grain boundary orientation and density can be governed by controlling the heating and especially cooling environment through which the wafer travels. The freeze interface F between the molten silicon L and the solid recrystallized silicon C is a key to understanding how heat flow considerations impact grain formation. As shown schematically in FIGS. 7, 7AI and 7AII, the freeze interface F is a surface at which liquid silicon L freezes and becomes solid recrystallized silicon C. The entire extent of the freeze interface F is at the melting point of silicon and therefore, the interface F is an isotherm. The shape of this isotherm is determined by how heat is removed from the cooling wafer 716. This shape in turn, impacts how grain structure propagates into the recrystallizing portion C of the wafer as the solidification continues. To freeze the molten silicon portion L and then to cool it, heat must be removed. In fact, due to the high heat of fusion of silicon, a great deal of heat must be removed from the freeze interface F, simply to accomplish the solidification of the silicon. This heat must first be conducted through the solid silicon C and the backing plates 724, 726 and then lost to the environment. The direction of heat flow is perpendicular to isotherms, including the isotherm that is the growth interface. (This is because the isotherm is at a uniform temperature, and heat cannot flow along it.) At first, a symmetric heat flow pattern will be discussed, followed by a discussion of several heat flow patterns, which are more preferred. The symmetric case is also useful, in some circumstances. For instance, if there is very little, or no nucleation of crystal growth at the intersection of the capsule and the freeze interface F, then problems of crystal growth orientation, discussed below, otherwise associated with the symmetric freeze interface, do not arise.

FIG. 7 schematically illustrates a three dimensional view of the freeze interface F between liquid portion L and solid portion C, during re-crystallization. The interface has compound curvature. Note that the curvature $F_u$ within the plane W of the wafer is exaggerated in this figure for explanatory purposes. The primary curvature of the interface $F_A$ is that which is visible in cross section shown in FIG. 7AI. This curvature will be the subject of discussion below. (No melt interface is shown in these figures. If present, it would be on the left, outside of the portions shown in the figures.)

FIG. 7AI shows such a cross-section of a sandwich 718 of backing plates 724, 726 and wafer 716 encapsulated within a capsule 720, during re-crystallization. As heat is lost symmetrically from the upper and lower faces of the wafer 716 and must be conducted through the wafer, the mid-plane MP of the wafer is a plane that is parallel to and half way between the primary, flat, non-edge surfaces of the wafer. It is where the temperature is highest in the region that the wafer is cooling. The interface $F_A$ has the symmetric shape shown. Arrows H show the local direction of heat flow. While heat flows perpendicular to the interface $F_A$, it is also true that grains tend to propagate perpendicular to the interface $F_A$. A likely way for grains to originate is by nucleation at the boundary between the wafer 716 and the thin film capsule 720, at points 717$u$ and 717$\ell$, shown in FIG. 7AII. Grains 715 nucleated at this interface will tend to propagate inward, toward the midplane of the wafer. As grains may be propagating from both the upper 717$u$ and lower 717$\ell$ boundaries simultaneously, there is a chance that grain boundaries will collide, such as at 721, resulting in grains that are relatively small and do not span the full thickness of the wafer 716. Further, grain boundaries resulting from collisions of two or more growing crystals tend to have significant components that are parallel to the wafer midplane. This degrades electrical properties, because it prevents crystals involved from spanning the entire thickness of the wafer.

It can be seen that if the incidence of grain nucleation is very low, then the probability that two grains will begin to grow in a manner that they will collide and form an undesirable grain boundary, such as at 721, are relatively low. Thus, if a capsule is used that has very low, or no propensity to nucleate grains, then the symmetric freeze interface $F_A$ shown in FIG. 7AI may provide acceptable results.

However, during cooling and freezing, heat flowing out of the recrystallizing wafer 716 at C can be deliberately biased toward either the top or bottom of the wafer, to create an asymmetric cooling profile and freeze interface $F_B$ as shown in FIG. 7BI. This in turn can result in an improved grain structure, as compared to that which results from a symmetric interface $F_A$. The impact of asymmetry in the interface $F_B$ can best be understood by considering the idealized case shown in FIG. 7BI where the interface is only slightly curved. Angles α and β are the angles of the interface with respect to the plane of respective surfaces of the capsule measured inside the liquid. These angles are referred to herein as the interface angles. In FIG. 7BI, interface angle β is less than 90 degrees and angle α is greater than 90 degrees. In contrast, note that the two corresponding interface angles in FIG. 7AI are both greater than 90 degrees. The freeze interface $F_B$ will be sloped so that the face with greater heat flux (the lower face, as shown in FIG. 7BI) will solidify first (namely, further upstream, to the left, as shown in FIG. 7BI).

When an interface angle is greater than 90 degrees, any grains nucleated at the corresponding face will tend to propagate into the solidifying wafer, as shown in FIG. 7BII. However, when an interface angle is less than 90 degrees, any grains nucleated at the corresponding face will tend to grow out and therefore not propagate into the growing wafer. The result will be that the grain structure is determined only by propagation from one face. As a result, for a freeze interface $F_B$, such as shown in FIG. 7BI, there will be few, if any, grain boundaries within the wafer which are substantially parallel to the midplane MP of the wafer, thus avoiding the deleterious impact of such grain boundaries.

FIGS. 7C and 7D show a portion of an encapsulated wafer 719 within a variety of asymmetric interface shapes $F_C$, and $F_D$, which will result in grain structure superior to that resulting from a symmetric profile as shown in FIG. 7AI. The asymmetry in these shapes is caused by asymmetry in the cooling profiles and the interface shapes $F_C$, $F_D$ are shown in order of increasing asymmetry in cooling profile from $F_C$ to $F_D$. While both interface angles in FIG. 7C are greater than 90 degrees, α is significantly larger than the other, β. As a result, the grain structure propagating from the face 751$_{αC}$ along the line $A_C$ where the interface angle α, is larger, will frequently out compete the grain structure propagating from the other face, 751$_{βC}$ along the line $B_C$. In other words, the crystal originating from face 751$_{αC}$ will extend further past the midplane than that originating from the face 751$_{βC}$ even, perhaps, all the way through the wafer thickness. The result is that there will be fewer grain boundaries running substantially parallel to the wafer face than in the symmetric case shown in FIG. 7AII.

FIG. 7D shows the case where one of the interface angles, β, is approximately 90 degrees. Any grains nucleated at the corresponding face of the capsule 751$_{βD}$, will propagate perpendicular to the surface $F_D$, along this face and hence, will not propagate into the wafer.

Different portions of this top-bottom temperature profile can be captured by biasing heat flow, using any of the methods described below.

The backing plates significantly help to reduce stresses during recrystallization and therefore to reduce formation of dislocations and other defects that stresses cause. As can be seen in both FIGS. 7AI and 7BI, the heat (indicated by arrows H) that is conducted away from the freeze interface $F_A$, $F_B$ largely flows toward the backing plates 724, 726, and perpendicular to the mid-plane of the wafer 716. Importantly, only a small portion of this heat is conducted parallel to the mid-plane of the wafer. The result is that the temperature gradients and curvatures along the recrystallized wafer can be small, resulting in low stresses during processing and therefore, low dislocation densities and thus, high electronic quality. This is in contrast to the situation in vertical ribbon growth techniques, such as EFG and String Ribbon, where the vast majority of the heat must be conducted along the growing ribbon. The difference is due to the presence of the thermally conductive backing plates 724, 726. These are very near the wafer and heat can flow to them, both by radiation and conduction/convection, through the thin layer of gas (typically air) present between the wafer 716 and its capsule 720 and the backing plates 724, 726. The air is present within the open spaces between particles in the porous, powder release layers 728. Or, if no release layer is present, sufficient air is present between the nominally flat, but not ideally flat surfaces of the backing plate and the film capsule. The heat flow perpendicular to the plane of the wafer can be used by the process designer, either to reduce stresses at a given recrystallization rate, or to increase recrystallization rate at a given stress level, or a combination of both. The effect is present in both the symmetrical and asymmetrical cases, shown in FIGS. 7AI and 7BI, respectively. In the asymmetric case it may be possible to further exaggerate the effect by imposing heat flow patterns which elongate the extent of the freezing interface $F_B$. The lower stresses present during the recrystallization will also result in lower residual stresses in the final wafer.

The simplest manner of applying top-bottom bias to a recrystallizing wafer can be achieved by operating the upper and lower heater elements in the recrystallization furnace to produce different heat flows $Q_1$, $Q_2$ with $Q_1 > Q_2$. This can be done most simply by operating them at different temperatures. In this manner, as shown in FIG. 8A, a hotter upper heater element 832a gives rise to a relatively larger heat from $Q_1$ and thus a locally wider molten zone L on the top face of the wafer 816. When coupled with the relatively smaller heat flow $Q_2$ and the narrower molten zone on the cooler bottom face of the wafer, the net result of this bias is an angled freeze front F.

A related means of imposing bias on heat flows out of the recrystallizing wafer involves placing heater elements of greater surface area on either the top or bottom side of the stack. With greater surface area, a heater element will radiate more heat $Q_1$, to the backing plate than a small-area heater element at the same temperature, which radiates a lesser amount of heat, $Q_2$. In this way, the same desired angled freeze front can be achieved as is shown in FIG. 8A. Similarly, more heater/per unit length of wafer may be placed on either the top or bottom side of the stack.

A further related means of imposing bias on the heat flows out of the recrystallizing wafer involves spacing heater elements away from the stack differently on the top and bottom. FIG. 8A shows symmetric location of heaters 832a, 834a, spaced apart equal distances du and dℓ from the wafer mid-plane MP. As shown in FIG. 8B, it is possible to space the upper heater 832b at a different distance du from the workpiece, than is the lower heater 834b, which is spaced away a larger distance dℓ. It is also possible (although not shown) to provide two pairs of heaters, one upstream and one down-stream. Similarly, upstream and down stream heaters could be provided with different heat outputs, as discussed above for a lone heater, or at different distances from the wafer.

A different method of imposing top-bottom bias on the heat flows out of the recrystallizing wafer involves using backing plates of different thermal properties, as determined by thickness, thermal diffusivity, emissivity, or any combination thereof. For instance, as shown in FIG. 8C, the lower backing plate 826$_C$ is significantly thicker than the upper backing plate 824$_C$. The heaters may be located equal distances zu=zℓ from the nearest surface of the respective backing plate 824c and 826c. Depending on the thermal properties of the backing plates used (i.e., whether in-plane conductive heat transfer or out-of-plane radiative heat transfer dominates), more heat will be extracted from either the top or bottom surface of the wafer, imposing thermal asymmetry. The solidification interface F will be inclined with respect to the wafer with interface angles α and β, as discussed above, which is the desired effect. The interface F is shown inclined with angle β greater than angle α. However, it could be inclined with α>β, depending on how the asymmetrical thermal properties affect heat flows.

As shown with reference to FIG. 8D, another possible method is to vary thermal shielding 840, such as insulation or some other sort of thermal element, such as heat spreading or shielding, which may be interposed between one or the other of the heaters 832d, 834d and the wafer 816, in an asymmetric arrangement. The shielding 840 can vary in its insulating or heat spreading, or other thermal transmission capacity, from one location to another with respect to both the heaters, 832d, 834d and the wafer 816. Further, the shielding elements can be made to be mobile with respect to the heaters or the wafer, or both. So that they move along with the moving wafer over some range, and then return to an initial position to move again with an upstream wafer.

Another way to establish a cooling profile bias is to vary the location of heaters above and below the wafer, so that for a unit length of wafer, there are more heating elements facing one surface, than the other surface.

The foregoing discussion has assumed that the heaters are relatively discrete elements, such as independent rods 832a, 834a. A distributed heat source may also be used for one or both surfaces of the wafer, and the distribution of heat output can be asymmetric with respect to the upper and lower surfaces.

Any of these techniques can be used alone, and most, if not all of them could be used in combination with any one or all of the others. Further, similar techniques not mentioned but later developed can also be used, and also, either alone, or in any combination.

There are various arrangements by which the wafer can be melted and then solidified to recrystallize, with respect to whether the wafer or the heaters move. In most situations, the physics/mechanics and thermo-dynamics are equivalent whether the wafer moves relative to the heat source, or the heat source moves relative to a stationary wafer. Or, of course, both can move, with a relative velocity therebetween. In the following discussion, to simplify, it is assumed that the heat source is stationary and the wafer moves. But, this need not be the case. It is the relative velocity between the two that is of ultimate interest. In general, all of the techniques discussed herein are forms of zone solidification.

With the configuration shown above in FIGS. 4A-4E the solid wafer moves gradually into the furnace. The leading edge of the wafer melts while the trailing edge remains unmelted, and a molten zone L arises within the wafer.

In general, the wafers can be between fifteen and three hundred cm long, along the dimension of motion. Of this, at any one time, 0.5 cm to five cm might be molten, with portions upstream being original solid, and portions downstream being re-crystallized solid.

As shown schematically in FIGS. 5A and 5B, it is also possible to provide a solid wafer, and then to provide generally uniform heating, so that the entire wafer becomes liquid. This liquid wafer material 516, retained within its capsule 520, such as of oxide, can then be moved away from the heat source 532, 534, gradually, generally in the same manner, as shown in FIG. 5B, such that a liquid to solid freeze interface F arises.

One possible advantage to the batch method shown in FIGS. 5A and 5B is that it may permit faster production of wafers than a moving melt zone method, as shown in FIGS. 4A-4E. A possible disadvantage of a batch method is that the capsule 520 contacts the molten material of the wafer 516, which molten material is somewhat reactive, for a relatively longer period of time.

It is also possible to cool the fully heated wafer preform all at once, rather than by zone cooling, relatively rapidly, as compared to zone cooling shown in FIG. 4C. Although crystal growth may nucleate in some places, if the number of nucleation sites is relatively small, the resulting crystal structure may be acceptable. An advantage of such a batch cooling method is that it will be appreciably faster than a zone cooling method.

Silicon dioxide (Silica) has been a capsule material used in the recrystallization step of the examples discussed herein. However, alternative materials can also be used. Silica is a particularly attractive choice for the thin film capsule for several reasons. It can be either grown on the wafer or deposited in very pure form by any of many available techniques. It is known that good wafers can be made from silicon which has been in contact with silica in the molten state. (For instance, silica crucibles are used in CZ growth.) Silica is amorphous in structure and hence can be expected to minimize nucleation of grains during recrystallization. Silica heals during high temperature processing in air due to in-situ oxidation of any exposed silicon. This self-healing confers robustness to the process. The ability to process in air aids in low cost processing. Silica can be doped, providing a way to control the viscosity and possible tendency for the films to nucleate grains and also for the possibility of in-situ doping. Finally, silica is relatively easy to remove from the wafer by selective etching.

There are various growth and deposition techniques for silica. Possible techniques include dry oxide growth (including in air or oxygen environments), wet oxide growth (including in a steam environment), spin-on glass, physical vapor deposition techniques, such as sputtering, and CVD deposition of oxide (both undoped and boron doped).

The oxide coatings can also act as diffusion barriers against impurities entering into the wafer.

A doped oxide film (which is softer at the recrystallization temperature) might nucleate fewer grains (which would be beneficial). Critically, a doped and softer film can exert less traction due to thermal expansion mismatch on the crystallizing silicon than an undoped film primarily by allowing some viscous slip during and immediately following the nucleation process. Further, the thermal expansion coefficient of doped silicon is more closely matched to silicon than that of silica. (Another potential advantage is in-situ doping to form a p+ back surface field.)

The thin film nature of the capsule allows it to be formed of multiple layers of different materials. For example, as shown schematically in FIG. 10, an inner layer 1020a of doped oxide could be provided to reduce/eliminate nucleation of crystals within the wafer 1016. This softer layer could be backed 1020b for strength by a deposited oxide, or other material—such as silicon nitride. Many such combinations exist. See FIG. 10, showing an assembly 1019, with silicon wafer 1016, at its center, surrounded by additional encapsulating layers 1020a, 1020b and 1020c which may be for any of the above purposes, or additional suitable purposes.

Not all capsule layers 1020a, 1020b, etc, must fully encapsulate the wafer, or that which is inside the capsule layer in question. The wafer 1016 must be fully encapsulated, but it need not be entirely encapsulated by any one layer. For instance, the outer layer 1020c might be present only on one or both of the top and bottom surface $1020C_t$, $1020C_b$, and act as a release from the backing plates, but need not then be present on the edges $1020C_e$. Different methods to apply such incomplete capsule layers are thus viable. A multiple layer capsule may provide enough strength to eliminate the need to use one or both backing plates.

It is possible, in some circumstances to provide a film covering around only a portion of the preform wafer, rather than all of it. For instance, if a film covers one major surface of a wafer alone, or one major surface and its four edges, for instance if a film is deposited on a wafer that is laying flat upon a support surface, so that one of its major surfaces is not exposed. Such a partial film covering may provide the strength to prevent balling up of the wafer as a result of adherence of the wafer to the partial film cover alone, as well as facilitating release of the recrystallized wafer from a supporting backing plate.

The film capsule is typically on the order of between about 0.25 microns and 5 microns thick, preferably between about 0.5 and about 2 microns thick. The extreme thinness of the films that are made possible by these techniques provides additional advantages. Because the film capsule 320 is so much thinner than the wafer 216 it envelops, its presence does not give rise to stresses in the wafer, as the two are heated through the recrystallization of the wafer, and then cool down. If the film were of a thickness similar to that of the wafer, unacceptably high stresses might arise that could break the wafer. In general, the thin film is able to bend, because it is so thin. It is, however, resistant to stretching and compressing within the plane of the film. Thus, when the contained molten silicon attempts to ball up, the film does not stretch and bulge out, but rather, it remains generally planar, albeit with bends and ripples, as shown in FIGS. 14A and 14B, discussed above.

Further, the film capsule is so thin that it is completely conformal to the surface shape of the wafer. Textured preforms may also be treated according to methods of inventions hereof, to form a recrystallized wafer that retains the surface texture.

As shown with reference to FIG. 9, a wafer 916 with a twenty micron pitch linear texture with grooves 917 approximately twenty microns deep was oxidized to receive a film of approximately one micron thick, which conforms entirely to all surfaces, without distorting the overall shape at all. It was then recrystallized. The capsule was strong enough to retain the vast majority of this fine scale structure although some fidelity was lost. Thus, textures may be provided for any purposes needed. For instance, for anti-reflection and contact groove formation, as discussed and disclosed in PCT Application No. PCT/US2008/002058, Filed: Feb. 15, 2008, in the names of Emanuel M. Sachs and James F. Bredt, entitled SOLAR CELL WITH TEXTURED SURFACES, claiming priority to U.S. provisional application, 60/901,511, filed Feb. 15, 2007, and U.S. provisional application 61/011,933, filed Jan. 23, 2008 and which designates the United States, which is incorporated fully herein by reference. Textures to achieve other functions, or the same functions, in different ways, may also be provided.

Alternative capsule materials are also likely to be useful, which are compounds of silicon and any and all of the following; nitrogen, carbon and oxygen. These include silicon nitride, silicon oxy-nitride, silicon carbide, and silicon oxy-carbide. These compounds can be made either by gas phase reaction of the silicon wafer or by chemical or physical deposition techniques.

These alternate materials must provide suitable physical integrity and minimal grain nucleation. These films must also be relatively easy to remove from the wafer 216 after recrystallization 122.

The encapsulating layer, for instance oxide, as discussed, may be applied at one of several different times in the process. It may be applied relatively long in advance, for instance hours or days, in a location and with equipment specifically designed only for the encapsulating step. Alternatively, the encapsulating step can take place immediately before the recrystallization step, and can be conducted in the same furnace and the same simple air environment. An integrated approach may lend itself to higher throughput, less material handling, storage, preparations, etc. However, care should be taken to avoid balling up of the silicon.

The backing plates 424 and 426 are flat substrates that confine the thin-film capsule 420 during recrystallization 122. The upper backing plate 424 is sometimes referred to herein as a capping plate. A preferred situation is a backing plate material that releases and separates cleanly from the material forming the thin film capsule 420. However, it is also possible that a mold release layer will be advantageous. A thin layer 428 of silica or other powder (FIG. 4A) may provide this function.

The following considerations can guide selection of backing plate materials and the design of the backing plate for any given situation. The backing plates should be made of a refractory material that is available in pure form and does not present a contamination threat to the wafer. (Although the capsule will act as a diffusion barrier, it should not be counted upon as perfect and so, metallics should be avoided). The backing plate should not undergo plastic deformation, nor incur cracks during the recrystallization in order to allow for extensive re-use. The backing plate should not buckle in use due to thermal stresses. It should remain flat. The backing plate material should have a relatively low coefficient of thermal expansion to minimize the thermal stresses induced by the heating and cooling profiles during recrystallization. A higher thermal conductivity will smooth local hot spots and also avoid high localized thermal stress. The backing plates preferably are suitable for firing in air.

Work described above has been performed with backing plates fashioned of pressureless sintered alpha silicon carbide, sold under the tradename "Hexoloy SE" from Saint Gobain, of Niagra Falls, N.Y. This material has many advantages. It is readily available in thin sheets and reasonably priced. It has a low CTE (4×10-6 1/K), high thermal conductivity (>50 W/mK), and high strength (380 MPa). It is known to tolerate extended service at temperatures up to 1650° C.—i.e. 200° C. higher than the present application demands. Its chemical purity is acceptable: total metallics of <200 ppm by weight, the majority of which is aluminum (iron and nickel together are <10 ppm by weight—approx 3 ppma). The performance of the Hexoloy SA is a suitable benchmark for comparison for other materials.

The material should retain its flatness over large areas while under thermal gradients representative of those that might be expected.

Alternate materials for backing plates include a full range of commercially available silicon carbide materials, including both alpha and beta forms of SiC as well as made by chemical vapor deposition.

In some cases, porous backing plates may help to prevent thermal shock and out of plane deformation due to the ability of the material to accommodate strain internally.

Silicon nitride, mullite and alumina are also candidate backing plate materials. Alumina is readily available and low in cost. However, the out-diffusion must be acceptable.

Graphite is also possible as a backing plate, for instance, SiC coated graphites—of the type used for CVD platens in microelectronic fabrication. If the SiC layer seals against oxidation, this may be an attractive material because the lower modulus of graphite means that lower in-plane stresses will develop when subjected to thermal gradients.

An important requirement is that the encapsulated, recrystallized wafer release cleanly from the backing plates. It is most advantageous if this can be achieved without a specialized mold release layer. This will be addressed by a combination of choice of backing plate material, backing plate surface texture, and wafer capsule material. At the temperatures in question (1420° C.), most materials react with one another, to at least a small degree. For example, silicon carbide oxidizes to form an outer layer of silica, which is then available for reaction with the capsule material of the wafer. Thus, success without a mold release layer will be more a question of kinetics—that is, during the duration of a recrystallization can the interaction be minimal enough to allow for easy release. If the duration of recrystallization is too long, virtually no combination will result in easy release. Creating surface texture on the backing plate, such as designed roughness may aid in localizing the opportunity for interaction between backing plate and wafer.

However, in many, if not most circumstances, it is likely that a mold release layer 428, as shown in FIG. 4A is required. One route, is to apply a thin layer (ideally single particle thick) of fine powder, for example, silica powder. Application may be by electrostatic powder coating. The mold release is approximately as thick as the capsule layer, or, even much thicker than the capsule layer. The powder acts as a lubricant, allowing motion between the backing plate and the wafer. Thus, although at these temperatures, the powder sinters together a bit and also sinters to the capsule on the wafer, there are enough gaps in the powder layer and the sintered joints are small in extent to enable easy release. As silica is not well wetted by molten silicon, the layers of powder act as a secondary barrier against the breach of containment of the capsule. Finally, the removal of powder which has stuck to the capsule typically occurs by undercutting during the etch removal of the capsule. In the case of silica however, removal can (if necessary) be guaranteed by longer immersion in the etch so that the powder itself is etched.

Other potential release layers can be made of silicon nitride, silicon carbide, alumina, or even graphite or carbon black powders. In the case of carbon-based powders, the mold release layer can be designed to burn up to release the wafer—although this may restrict the recrystallization to non-oxidizing atmospheres.

The release layer might also be liquid (such as molten tin). It is important that the film capsule act as a diffusion barrier against any such liquid release layer interacting with the wafer material.

It is also possible in some circumstances to eliminate the upper backing plate 424. As shown in FIG. 11, ather than using a solid backing plate, it is possible to use a layer 1124 of particulate material, or a powder, on the upper surface of the wafer 1116. A particulate release layer 1128 may also be used with the particulate backing element on one or both faces of the encapsulated wafer 1119. One problem with backing plates is that they tend to warp, and/or bend. If a discontinuous body of particles, or perhaps lightly sintered continuous or partially continuous body is used, it tends to retain its flatness. In particular, what is important is that the surface of the backing element, such as a volume of particles, that faces the wafer and its capsule 1120, remain flat. It has been found that acceptable results are obtained with powder. The powder may be sintered on top of the wafer before the wafer is placed in the recrystallization furnace. It is also possible to use a powdered backing element on both sides of the wafer.

Generally, the same materials that are suitable for solid backing plates are useful for particulate packing elements, including silica, silicon carbide, silicon nitride. A mold release layer 1128 may also be beneficial.

Another possibility to reduce the tendency of backing plates to warp, is to increase their strength by adding ribs to the face of the backing plate that faces away from the wafer. The ribs could be aligned along the direction that the wafer moves, or perpendicular thereto, or both (such as in a rectilinear grid) or in any other orientation.

It is also possible, as shown in FIG. 12, to stack wafers 1216*u*, 1216*l*, and their backing plates 1224, 1225, 1226, on top of one another for one or more stages of heating. In this manner, fewer than two backing plates for each wafer may be used. For instance if two wafers are stacked upon each other, only three backing plates rather than four are required. Stacking also has advantages that more wafers can be processed in less time, than if each must be processed as a single. More than two wafers can also be stacked, as shown in FIG. 13, where a stack 1318 of wafers 1316*u*, 1316*m*, 1316*l*, has four backing plates 1323, 1324, 1325, 1326. It is also possible to establish asymmetric cooling profile by providing backing elements of different thicknesses or thermal properties, such as is shown with elements 1323 and 1324 being thicker than elements 1325 and 1326.

Stacks of exactly two wafers provide a special advantage over single wafer sandwiches, and stacks of more than two wafers.

As shown in FIG. 12, a stack 1218 of two wafers, 1216*m* and 1216*l*, with a backing plate 1225 in between, automatically establishes a beneficial asymmetric cooling profile within each wafer, even if the heating environment surrounding the wafer pair is uniform. This is because the symmetry of the two wafer situation with respect to the mid-plane MP of the backing plate 1225 that is between the two wafers, results in there being no heat flow across the center backing plate 1225. Thus, the heat flows from within each wafer 1216*u* and 1216*l*, outward, away from the central backing plate. This then establishes an asymmetric cooling profile of the desired shape away from each wafer, that will result in the desired orientation of grain boundaries.

It has been mentioned that there are some circumstances where wafers with a surface texture are desired. The surface texture may be for light trapping, or processing purpose, or other purposes. In some cases, the texture may be imparted to the resulting wafer by providing backing plates with a suitably textured surface. In such a case, the backing plate acts as a mold or form and the texture arises during the re-crystallization heating steps.

A basic zone recrystallization furnace is suitable for practicing inventions disclosed herein. A cluster of silicon carbide heater rods provides localized heating for inducing a molten zone. They are made of high-purity, dense silicon carbide. High chemical purity in the heater elements is necessary to minimize the risk of metallic contamination of the silicon wafers. (Conventional silicon carbide elements are highly doped and are replete with metallic impurities.) The rods used in the examples herein are sold under the tradename Hexoloy™ and are available from Saint Gobain of Niagara Falls, N.Y.

Pure silicon carbide is a semiconductor and as such, it has a negative temperature coefficient of resistivity. The furnace requires preheating before it can be electrically powered into a self-sustaining temperature ramp, but once it comes up to temperature, the negative temperature coefficient ensures that the heating is uniform along the length of the heater. Any region of the heater elements running slightly cooler than average becomes more resistive, causing it to generate more heat, raising the temperature back up. This self-correcting thermal uniformity helps ensure side-to-side uniformity in the temperature profile of the furnace.

The heater rods are supported by a structure built of high-temperature insulation, made of pure porous silicon carbide. The fabrication method for the insulation developed by the present inventors uses a pre-ceramic polysilazane liquid polymer mixed with ultra pure silicon carbide powder. The powder is supplied by Saint Gobain and is used in their line of Crystar™ products. Insulating furnace components are molded under light isostatic pressure into simple molds and then fired. The ceramic bodies are formed by pyrolysis of the pre-ceramic polymer that becomes distributed between grains of powder by capillary attraction. The product is a porous silicon carbide body of exceptionally high purity and very good insulating quality.

To improve the insulating properties of the SiC insulation, a low density structure is beneficial. A fugitive powder can be added to the uncured mix, which can burn out upon firing and leave a structure with higher porosity. Graphite powder is a reasonable choice for the fugitive material as it will retain its integrity until a fairly high firing temperature (approx 700° C.) and then burn out cleanly. Polymeric powders, including acrylic and polystyrene, can also be used.

The backing plates 424, 426 are fully dense SiC plates, and can be between approximately one and about ten mm thick, preferably between about one and about four mm thick. In the examples below, a thin layer 428 of silica powder (about one micron thick) was coated onto the backing plates using electrostatic powder coating methods. The sandwich assembly 418 of backing plates 424, 426 and wafer 416 in capsule 420 is supported on ceramic carrier rods that transport it via a lead-screw servo drive through the hot zone of the furnace. The elegance of construction and operation of the recrystallization furnace allows massive parallelization of the recrystallization process. To put the scale of the various items in perspective, for a typical sandwich assembly 418, the backing plate could be about 2 mm thick. The wafer between the backing plates would be about 200 microns (0.20 mm thick). The oxide capsule 420 could be about one micron thick, as could be the powder release layer 428. Thus, the backing plates in this example are on the order of ten times as thick as the coated wafer, which is about two hundred times as thick as the oxide layer on one face.

An important factor for temperature control lies in good temperature measurement—of the heater rods themselves, the furnace ambient, and the wafer/backing plate. The temperature of the heater rods can be inferred from the resistance of the rods—measured in-situ. Radiometric temperature measurements will be used for the furnace ambient and for the wafer/backing plate assembly.

Formation of Wafers

The original preform wafers 216 that are used in these processes, and that are encapsulated within a thin film 320, can be produced by any suitable fashion. Two are mentioned here as representative. However, any suitable fashion is contemplated to be within the inventions disclosed herein. These two methods are: rapid solidification method; and chemical vapor deposition. Typically, they can have a grain size with a small average grain size, for instance, less than the desireable 3 $mm^2$, and, in particular, less than about 1 $mm^2$.

Rapid solidification methods can be used to create the starting original preform wafers 216 by melting silicon and then causing it to be suddenly presented to a cool substrate, against which it rapidly freezes. Two of the techniques known in the art of rapid solidification are: melt spinning; and spray deposition. In melt spinning, a stream of molten material is jetted against the periphery of a cooled, rotating wheel in the shape of a disk. Due to the impingement of the jet, the liquid thins out when it hits the rotating disk. The thin liquid film cools rapidly by heat conduction in the disk, thereby causing solidification to take place rapidly (typically in under one millisecond). The rapidity of solidification prevents the liquid from bonding or adhering to the disk.

In spray deposition, small droplets of molten material (from a plasma spray gun, for example) are directed toward a cool substrate with rapid solidification resulting. These methods and suitable modifications of them can be used to melt and rapidly solidify silicon into thin sheets. A jet of molten silicon can be made, for example by melting silicon in a container and then applying gas pressure to the top of the liquid so as to force a jet out a hole in the bottom of the container. The spinning disk may be replaced by a belt or a closely spaced series of planar substrates which move under the jet.

In general, other forms of rapid solidification have been used with the foregoing technologies. These are suitable to produce the type of preform wafer for use with inventions disclosed herein.

The starting original preform wafer 216 can also be made by chemical vapor deposition (CVD) from a silicon bearing gas. CVD is used to make rods and pellets of silicon from silane or trichlorosilane to create the polysilicon feedstock which is then melted to make ingots. Epitaxial deposition of silicon films, typically on top of silicon wafers, is used to make high quality silicon layers for semiconductor devices in the microelectronics industry. Free standing silicon bodies can be made by CVD onto non-silicon substrates, followed by removal from the non-silicon substrate. For example, silicon can be deposited onto graphite substrates. The bond formed is weak and during cooling, the difference in thermal contraction can aid removal of the silicon from the substrate. Further, while silicon epitaxy on silicon must be done at high temperatures to propagate single crystal growth, the free standing sheet can be deposited at low temperatures, because very small grain size is acceptable.

All or part of a capsule may be deposited on the original perform wafer by chemical vapor deposition by changing the gas from just a silicon bearing gas, to a gas or gases that deposit $SiO^2$, SiNi, SiC, or any other suitable capsule material, as discussed.

Wafers of a variety of types of semiconductor (not just Si) can be made without the expense of sawing and of removal by etching of the saw-damage region on the wafer surface. Utilization of silicon is improved and waste streams are reduced. For instance, these techniques can be used with other semiconductors, including but not limited to germanium and other elemental semi-conductors, and compound semiconductors, such as gallium arsenide. The integrity of the film capsule will help to maintain the stochiometry of the compound. Further, crystalline wafers of other materials, including metals and ceramics could be produced by this method.

The thin film capsule 420 retains the material and shape of the wafer 416 during recrystallizaton. It also provides a diffusion barrier against impurities entering the wafer 416 during processing.

The wafer 416 may be supported on or surrounded by backing plates 424, 426, which guarantee flatness, but also provide paths for heat removal from the cooling wafer. These heat removal paths reduce the amount of heat that must be removed by conduction in the wafer itself and therefore allow for reduced stresses during cooling. This in turn reduces defect formation (especially dislocations). The production of discrete wafers (rather than continuous strips) also allows for lower stresses during cooling, because continuous strips must, by symmetry considerations, have principal stresses along and perpendicular to the growth direction, while discrete wafers can have other stress states.

The grain size and structure of the wafer is controlled by a combination of: choice of material for the thin film capsule 420; and the thermal conditions in the furnace. A capsule material may be chosen which, due to its structure, tends not nucleate grains. Silica, an amorphous material, is an example. Alternatively, capsule materials may be chosen to deliberately nucleate grains, should such be desired. The thermal environment can be made deliberately different on the two sides of the wafer, so that grains will tend to propagate only from one face of the wafer, thus ensuring that there are no (or, few) grain boundaries in the thickness of the wafer.

The combination of reduced stresses and dislocations together with control over grain size and placement allows for the production of very high quality wafers. Support by the combination of capsule 420 and backing plates 424, 426 means that thin wafers can be made, thereby reducing silicon consumption and improving cell efficiency.

The geometry definition afforded by the capsule allows for the recrystallization of textured wafers, which bear a desired topography from previous steps. This can aid, for example, in creating light trapping features in solar cells.

The furnace construction itself is simple, in large part because it can operate in an air environment, obviating the need for a containment vessel and cooling thereof. The furnace can be built of insulation brick and air-compatible heater rods. Both insulation and heaters can be of silicon carbide, for example.

The method can be scaled up in production. First, the simplicity of the furnace means that many furnaces can be constructed. Second, stacks of two or more wafers can be processed in a given furnace, generally with backing plates between them. Two wafers stacked is a particularly advantageous situation because the two can be subject to identical thermal environments.

The process may be practiced where a molten zone L (FIG. 4C) is moved through the wafer 416 (typically as the wafer moves through a location in space in which that portion of the wafer in the location is molten. As shown in FIGS. 5A and 5B, it is also possible to melt the entire wafer and then solidify directionally. This method can facilitate furnace constructions where there are many wafers in-line that are being processed simultaneously.

The present inventions can be practiced with original wafer preforms 216 that are a wide range of sizes and shapes. Presently, an industry standard cell size is 156×156 mm. The preforms can be this size. They can be slightly larger, so that they can be trimmed after recrystallization to the exact size needed, for example, by laser cutting. However, the preforms need not be square. They can be in the form of a strip, for example. The strip can be recrystallized and then, if needed, cut into individual wafers. An advantage of recrystallizing a strip, is that fewer pieces are handled. A disadvantage is that impurities which are swept along by the moving solidification are aggregated over a longer length and the effect of the purification that results may be reduced. Recrystallizing in shorter lengths, as small as the desired end cell size, also may have an advantage in reducing thermal stresses during recrystallization. When long strips or continuous lengths are recrystallized, the stresses during cooling must, by symmetry considerations, assume particular forms. However, short pieces, can assume a wider range of stress configurations during the cooling phase. This extra flexibility will allow for lower stresses and lower defect densities during cooling.

Heating and recrystallizing a square or rectangular wafer has been described generally above, assuming that a straight edge is presented first to the heater. When processing a square preform, it is also possible to introduce a corner first into the heater, and this has some advantages. When a straight edge is presented first, each location along the entire length of the edge is a potential site for unwanted nucleation of a grain. When a corner is presented first, fewer potential grain nucleation sites are presented to the elevated temperature. Thus, it is sometimes more likely that a single crystal will arise when a corner is introduced into the molten zone first, rather than a straight edge.

The foregoing has described apparatus and methods that generally orient the wafer preform 416 with its capsule 420 horizontally. In other words, the thin (thickness) dimension of the wafer is aligned vertically, with the two larger dimensions (width and length) establishing a horizontal plane. The preform then moves along a generally horizontal path through the furnace, and other stages. However, it is also possible, as shown in FIG. 15, to orient the preform 1516 with the thin dimension aligned horizontally, and a long, typically the longest dimension, arranged vertically, and to move it vertically through a furnace, either upward or downward. With a vertically oriented apparatus, the backing elements 1524, 1526 must be arranged to provide the necessary support of the capsule 1520 walls as the wafer 1516 melts and recrystallizes, so that the encapsulated wafer retains its desired shape, with flat surfaces.

It is also typically helpful to provide a transport mechanism, which may include clamp elements 1511, 1512, that secure and move the wafer along, and also spacers, which prevent the wafer from being squashed under influence of the claming forces. The clamping elements may be integral, such as a large c-shaped clamp. Or, two or more independently operable elements may be forced together, to clamp the wafer therebetween.

Similarly, rather than being oriented substantially horizontally or vertically, the wafer can be placed at any orientation in between vertical and horizontal, as it passes through the stages of processes disclosed herein.

The methods disclosed herein may also be used to improve the crystal structure of conventionally manufactured multi-crystalline wafers. They can be used in the place of the original wafer preform 216, as shown in FIG. 2, and all other figures, such that their crystal structure is improved to have relatively larger average crystal size structure discussed herein.

PARTIAL SUMMARY

A preferred embodiment of an invention hereof is a method for making a semiconductor wafer, comprising the steps of: providing an original semiconductor wafer having a first grain structure, having a first average grain size; providing a thin film capsule over substantially the entire surface of the wafer to form an encapsulated wafer; and heating and cooling the encapsulated wafer under conditions such that the original wafer becomes molten and then recrystallizes with a second grain structure of second average grain size, which is larger than the first average grain size, and such that the film remains substantially intact.

The step of heating and cooling may be conducted in air.

The second average grain size is typically greater than about one $mm^2$, but may be beneficially great than even about ten $mm^2$. The first average grain size may be less than about ten $mm^2$, and is typically less than about one $mm^2$. The first average grain size may be typically less than about one $mm^2$ and the second average grain size may be beneficially more than about ten $mm^2$.

The film performs one or more functions. According to one important aspect of an invention hereof, the film prevents the wafer from balling up during heating and recrystallization. According to another, the film has a surface that does not strongly promote grain nucleation during recrystallization. With yet another, the film has a surface that promotes grain nucleation during recrystallization to a known degree. With other important embodiments of inventions hereof, the film prevents contamination of the recrystallized wafer by elements in the environment in which recrystallization occurs.

A basic embodiment of an invention hereof further comprises the step of removing the film.

The film may be an oxide film. The step of providing an oxide film may comprise heating the original wafer in an environment that contains oxygen so that a thin oxide layer forms on substantially the entire surface of the original wafer. The step of providing oxide may comprise dry oxide growth.

In a different embodiment, the step of providing oxide comprises wet oxide growth.

For a beneficial embodiment, the step of heating the original wafer in an environment containing oxygen so that an oxide layer forms is conducted at a time immediately before the step of heating the encapsulated wafer under conditions such that the original wafer recrystallizes, and within the same heating environment. The oxidation may be conducted under the conditions such that the original wafer becomes molten, and within a furnace in which the original wafer is to become molten.

In an alternate embodiment of an invention hereof, the step of heating the original wafer in an environment containing oxygen so that an oxide layer forms is conducted at a time significantly before the step of heating the encapsulated wafer, and under different conditions from those under which the original wafer recrystallizes.

The environment in which the wafer is heated may comprise air or steam.

Yet another preferred embodiment of an invention herof has the step of providing a film comprise directly depositing a film on the original wafer, such as by spun on glass, sputtering, physical vapor deposition, or chemical vapor deposition.

With still another important embodiment of an invention hereof, before the step of recrystallizing, at least one backing element is provided adjacent at least one surface of the film, which backing element supports the film to remain substantially flat. The film beneficially comprises a material that prevents the original wafer from adhering to the at least one backing element during heating and recrystallization.

A related embodiment further comprises providing a release material between the film and the at least one backing element. The release material may comprise a particulate.

The at least one backing element may comprise a pair of backing elements, each adjacent one of two opposite faces of the film. The pair of backing elements may be of equal thickness, or of unequal thicknesses. They may also have dissimilar thermal properties from each other.

With a typical embodiment, the step of providing at least one backing element comprises providing the encapsulated wafer in a substantially horizontal position, with one face facing gravitationally upward, the pair of backing elements being arranged below and above the encapsulated wafer. It may also be arranged vertically.

The backing elements may comprise silicon carbide. They may be substantially flat plates. The backing element that is above the wafer may comprise a volume of particulate material. A release material may be provided between the film and the particulate material backing element. The volume of particulate material may usefully comprise sintered particulate material.

According to another useful embodiment of an invention hereof, the wafer may be provided in a position, such that a line that is normal to the wafer mid-plane has a component that is not vertical, relative to a local gravitational field. Or, the wafer may be provided in a position, such that a line that is normal to the wafer mid-plane is horizontal, relative to a local gravitational field.

For a very important embodiment of an invention hereof, the step of cooling comprises, establishing within the heated, encapsulated wafer, a freeze interface between a zone of liquid and a zone of recrystallized semiconductor, which freeze interface is asymmetric with respect to the wafer mid-plane. Under different conditions, the freeze interface is symmetric with respect to the wafer mid-plane.

According to one very useful embodiment of an invention hereof, the entire encapsulated wafer is heated at substantially the same time. Or, the step of heating may comprise providing motion of the encapsulated wafer relative to a heated zone, and melting a portion of the wafer that is smaller than its entire extent.

Another preferred embodiment of an invention hereof entails the step of cooling by establishing within the heated wafer, a freeze interface between a zone of liquid and a zone of recrystallized semiconductor, which freeze interface is concave toward the liquid zone, asymmetric with respect to the heated wafer mid-plane and which meets the film at an interface angle of greater than 90 degrees toward the liquid zone at a first location and less than or equal to 90 degrees toward the liquid zone at a second location.

There are many different ways to provide an asymmetric cooling environment.

According to one such method, it is accomplished by providing at least one heater that establish a greater heat flow toward one surface of the heated wafer, as compared to the opposite surface. It is also possible to provide heat shielding elements arranged asymmetrically with respect to the midplane of the heated wafer, between heat sources and opposite surfaces of the heated wafer. Another way to achieve the asymmetry is with heaters spaced per unit length of heated wafer, asymmetrically with respect to the mid-plane of the heated wafer. An asymmetric cooling environment can be established by providing a pair of heaters of equal heat output spaced asymmetrically away from the mid-plane of the heated wafer.

A similar, important embodiment has the step of cooling comprising, establishing within the wafer a freeze interface between a zone of liquid and a zone of recrystallized semiconductor, which freeze interface is asymmetric with respect to the heated wafer mid-plane, and further, wherein the at least one backing element is arranged so that significant heat flows from the recrystallized wafer into the backing element and away from the recrystallized wafer.

With a major embodiment, the semiconductor comprises silicon.

The film may be doped silicon dioxide, or silicon nitride, or a compound of silicon and at least one of the group consisting of: nitrogen, carbon and oxygen.

Some important aspects of the invention relate to formation of the original wafer. It may be formed by a rapid solidification technique, for instance, melt spinning or spray deposition.

Or, according to a useful embodiment of an invention hereof, the wafer may be formed by chemical vapor deposition from a silicon bearing gas. In which case, it is very convenient to provide the film by applying a film by chemical vapor deposition.

The original wafer may be a conventional multi-crystalline wafer.

It is very useful for the recrystallized wafer to have a uniformity of thickness of within about ten percent over its extent, which is possible with embodiments of this invention. The original wafer may have a thickness of between about 50 microns and 400 microns, preferably between about 100 microns and 250 microns. In this connection, it is a beneficial embodiment when the film layer has a thickness of between about 0.25 microns and 5 microns and preferably between about 0.5 microns and 2 microns.

It is highly useful that, the film being so thin, the wafer may have a textured surface and the film will conform to that.

With some important embodiments of method inventions hereof, the step of providing a film comprises providing a plurality of nested films that each surround substantially the entire surface of the original wafer.

Or, it may be that the step of providing a film comprises providing a plurality of nested films which, together, surround substantially the entire surface of the original wafer. At least one of the plurality of nested thin films may surround less than the entire surface of the original wafer.

If backing plates are used, as is frequently useful, a release material may be provided between the film and at least one of the at least one backing element, which release material may be particulate.

An important family of embodiments of method inventions hereof further comprises stacking at least two encapsulated wafers with a backing element therebetween, between at least two more backing elements. In such case, the step of heating and cooling the wafer comprises heating and cooling the at least two encapsulated wafers stacked together. All of the backing elements may be of equal thickness, but they need not be. They may also be of dissimilar thermal properties.

The step of heating and cooling the wafer may beneficially comprise providing relative motion between the wafer and a heating environment that establishes a molten zone within the wafer, such that a trailing edge portion of the recrystallized wafer has a greater median concentration of impurities than other portions of the recrystallized wafer. This is a type of zone refining. A useful exploitation of this refining further comprises removing the trailing edge portion from the other portions of the recrystallized wafer. Eruptions of recrystallized wafer typically occur, which have a higher level of impurities than the other portions of the wafer. It is useful to remove the eruptions from the other portions of the recrystallized wafer.

Aspects of the heating environment are aspects of method inventions hereof, including heating using silicon carbide heating elements. The step of heating is beneficially conducted in a furnace that has porous insulation comprising silicon carbide powder mixed with pre-ceramic polymer liquid.

Yet another preferred embodiment of an invention hereof is a method for making a semiconductor wafer, comprising the steps of: providing an original semiconductor wafer having a first grain structure, having a first average defect density; providing a thin film capsule over substantially the entire surface of the wafer to form an encapsulated wafer; and heating and cooling the encapsulated wafer under conditions such that the original wafer becomes molten and then recrystallizes with a second grain structure of second average defect density, which is less than the first average defect density, and such that the film remains substantially intact.

Still another preferred embodiment of an invention hereof is a method for making a semiconductor wafer, comprising the steps of: providing an original semiconductor wafer having a first grain structure, having a first average grain size; providing a thin film capsule over less than the entire surface of the wafer to form an covered wafer; and heating and cooling the covered wafer under conditions such that the original wafer becomes molten and then recrystallizes with a second grain structure that is improved from the first grain structure, either in grain size of defect density or both, and such that the film remains substantially intact.

Yet another preferred embodiment of an invention hereof is a semiconductor wafer comprising a body portion comprising a semiconducter wafer, having two substantially flat opposing surfaces and a crystal structure with an average crystal grain size less than about ten $mm^2$. Substantially completely surrounding the body portion is a thin film capsule. The thin film comprises a plurality of nested thin films.

The semiconductor may beneficially comprise silicon, with at least one film of the film capsule comprising silicon dioxide. At least one film of the capsule may comprise doped silicon dioxide. At least one film of the capsule may comprise silicon nitride. More generally, at least one film of the capsule may comprise a compound of silicon and at least one of the group consisting of: nitrogen, carbon and oxygen.

At least one of the flat body surfaces may comprise a textured surface.

With a useful embodiment, the wafer may have a thickness of between about 50 microns and about 400 microns, preferably between about 100 microns and about 250 microns.

Typically, with another preferred embodiment of an invention hereof, the nested film layer has a thickness of between about 0.25 microns and about 5 microns, preferably between about 0.5 microns and about 2 microns.

In one version, each of the plurality of films surround substantially the entire surface of the wafer. Together, the plurality of nested films may surround substantially the entire surface of the wafer. Or, at least one of the plurality of nested thin films may surround less than the entire surface of the wafer.

A somewhat different preferred embodiment of an invention hereof is a semiconductor wafer assembly comprising: a body portion comprising a semiconducter wafer, having two substantially flat opposing surfaces and a crystal structure with an average crystal grain size less than about ten mm². Substantially completely surrounding the body portion, is a thin film capsule. The wafer assembly further comprises at least one backing element adjacent at least one surface of the oxide film.

The at least one backing element may comprise a pair of backing elements, each adjacent one of two opposite faces of the film layer. The wafer may be in a substantially horizontal position, with one face facing gravitationally upward and the pair of backing elements being arranged below and above the wafer. The backing elements may beneficially comprise silicon carbide. They may be substantially flat plates. The backing element that is above the wafer may comprise a volume of particulate material, which may be sintered.

Many techniques and aspects of the inventions have been described herein. The person skilled in the art will understand that many of these techniques can be used with other disclosed techniques, even if they have not been specifically described in use together. For instance any suitable original wafer material can be used, which will be improved in grain size, or defect density or both. The capsule may be fully enclosing, or only partially. It may be oxide, or any other suitable film. It may be grown, or deposited, or otherwise provided. Backing plates may be used, if necessary, or not. They may be solid, or particulate, or a combination, thereof. A release layer, typically particulate may be used. The combination of film, release layer, backing plate material should result in the encapsulated wafer being removable from whatever support is provided during recrystallization. Any suitable means to form the original wafer preform may be used, and any suitable method to provide the capsule may be used. Combinations that have been disclosed, such as using CVD to both form the wafer and provide the film need not be used. The freeze interface may be symmetric, if nucleation of grains is acceptably low, or, it may be asymmetric. If asymmetric, then any of the many ways shown to establish an asymmetric cooling profile, and thus freeze interface can be used, as well as any subsequently developed. Single wafer sandwiches of two backing plates may be used with any of the furnace configurations and any of the wafer material, film materials disclosed. Or, multiple wafer stacks may be used with any of the variations in materials or formation methods. Batch or serial production may be used, as appropriate, given throughput demands and quality tradeoffs.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A method for making a semiconductor wafer, comprising the steps of:
   a. providing an original free standing semiconductor wafer having a first grain structure, having a thickness of greater than 50 microns and a first average grain size;
   b. supporting the wafer with at least one support element;
   c. providing a thin film capsule over all of the surface of the wafer except any portion that is blocked by the at least one support element, to form a partially encapsulated wafer; and
   d. heating and cooling the partially encapsulated wafer under conditions such that the original wafer becomes molten and then recrystallizes with a second grain structure of second average grain size, which is larger than the first average grain size, and such that the thin film capsule remains substantially intact.

2. The method of claim 1, further wherein the step of heating and cooling is conducted in air.

3. The method of claim 1, the at least one support element comprising a plurality of support elements.

4. The method of claim 1, the at least one support element comprising a surface.

5. The method of claim 1, the thin film capsule preventing contamination of the recrystallized wafer by elements in the environment in which recrystallization occurs.

6. The method of claim 1, the step of providing the thin film capsule comprising providing an oxide film.

7. The method of claim 1, further comprising, the step of heating the original wafer in an environment containing oxygen so that an oxide layer forms, conducted at a time immediately before the step of heating the encapsulated wafer under conditions such that the original wafer recrystallizes, and within the same heating environment.

8. The method of claim 1, further comprising, the step of heating the original wafer in an environment containing oxygen so that a thin oxide layer forms, conducted at a time significantly before the step of heating the encapsulated wafer and under different conditions from those under which the original wafer recrystallizes.

9. The method of claim 1, the step of cooling comprising, establishing within the heated wafer, a freeze interface between a zone of liquid and a zone of recrystallized semiconductor, which freeze interface is concave toward the liquid zone, asymmetric with respect to the heated wafer mid-plane and which meets the film at an interface angle of greater than 90 degrees toward the liquid zone at a first location and less than or equal to 90 degrees toward the liquid zone at a second location.

10. The method of claim 1, the step of heating and cooling comprising providing an asymmetric cooling environment with respect to the mid-plane of the heated wafer.

11. The method of claim 1, the thin film capsule having a thickness of between about 0.25 microns and 5 microns.

12. The method of claim 1, the step of providing a thin film capsule comprising providing a plurality of nested films which, together, surround substantially the entire surface of the original wafer.

13. The method of claim 1, the step of providing a thin film capsule comprising providing a plurality of nested thin films at least one of the plurality of nested thin films surrounding less than the entire surface of the original wafer.

* * * * *